United States Patent
Saito et al.

(10) Patent No.: US 12,236,988 B2
(45) Date of Patent: Feb. 25, 2025

(54) MAGNETIC LAMINATED FILM, MAGNETIC MEMORY ELEMENT, MAGNETIC MEMORY, AND ARTIFICIAL INTELLIGENCE SYSTEM

(71) Applicant: TOHOKU UNIVERSITY, Sendai (JP)

(72) Inventors: Yoshiaki Saito, Sendai (JP); Tetsuo Endoh, Sendai (JP); Shoji Ikeda, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 179 days.

(21) Appl. No.: 17/860,546

(22) Filed: Jul. 8, 2022

(65) Prior Publication Data

US 2023/0028652 A1    Jan. 26, 2023

Related U.S. Application Data

(63) Continuation of application No. PCT/JP2020/048409, filed on Dec. 24, 2020.

(30) Foreign Application Priority Data

Jan. 10, 2020    (JP) .................................. 2020-003269

(51) Int. Cl.
*G11C 11/00*    (2006.01)
*G06N 3/063*    (2023.01)
(Continued)

(52) U.S. Cl.
CPC ............ *G11C 11/161* (2013.01); *G06N 3/063* (2013.01); *G11C 11/1673* (2013.01);
(Continued)

(58) Field of Classification Search
CPC ........ H10N 50/10; H10N 50/85; H10N 52/80; H10N 50/80; H10N 50/01; H10N 52/00; H10N 50/00; H10N 52/101; H10N 52/01; H10N 50/20; G11C 11/161; G11C 11/1675; G11C 11/18; G11C 11/1659; G11C 11/1673; G11C 11/15; G11C 11/1653; G11C 11/1655; G11C 11/16; G11C 5/02; G11C 11/165; G11C 11/1693;
(Continued)

(56) References Cited

U.S. PATENT DOCUMENTS 7,859,034 B2 * 12/2010 Huai .................... G11B 5/3909
                                                                  257/295
11,594,357 B2 *  2/2023 Qoutb .................... H10N 50/85
(Continued)

FOREIGN PATENT DOCUMENTS

JP    2017-112351 A    6/2017
JP    2018-508983 A    3/2018
(Continued)

*Primary Examiner* — Thong Q Le
(74) *Attorney, Agent, or Firm* — Rabin & Berdo, P.C.

(57) ABSTRACT

A magnetic multilayer film for a magnetic memory element includes an amorphous heavy metal layer having a multilayer structure in which a plurality of first layers containing Hf alternate repeatedly with a plurality of second layers containing a heavy metal excluding Hf; and a recording layer that includes a ferromagnetic layer and that is adjacent to the heavy metal layer, the ferromagnetic layer having a variable magnetization direction.

13 Claims, 22 Drawing Sheets

(51) Int. Cl.
  *G11C 11/16* (2006.01)
  *G11C 11/18* (2006.01)
  *H01F 10/32* (2006.01)
  *H10B 61/00* (2023.01)
  *H10N 50/10* (2023.01)
  *H10N 50/85* (2023.01)
  *H10N 52/80* (2023.01)

(52) U.S. Cl.
  CPC .......... *G11C 11/1675* (2013.01); *G11C 11/18* (2013.01); *H01F 10/3286* (2013.01); *H10B 61/00* (2023.02); *H10N 50/10* (2023.02); *H10N 50/85* (2023.02); *H10N 52/80* (2023.02)

(58) Field of Classification Search
  CPC ....... G11C 11/54; G11C 11/5607; G11C 7/20; G11C 2213/71; H10B 61/22; H10B 99/00; H10B 61/00; H10B 61/20; H10B 61/10
  See application file for complete search history.

(56) References Cited

U.S. PATENT DOCUMENTS

| | | | |
|---|---|---|---|
| 11,610,614 B2* | 3/2023 | Saito | ........................ H01F 10/30 |
| 2017/0229160 A1 | 8/2017 | Ma et al. | |
| 2017/0330070 A1 | 11/2017 | Sengupta et al. | |
| 2018/0005677 A1 | 1/2018 | Gaudin et al. | |
| 2019/0131517 A1 | 5/2019 | Shiokawa et al. | |

FOREIGN PATENT DOCUMENTS

| | | |
|---|---|---|
| WO | 2017/208576 A1 | 12/2017 |
| WO | 2018/155078 A1 | 8/2018 |

* cited by examiner

MAGNETIC LAMINATED FILM, MAGNETIC MEMORY ELEMENT, MAGNETIC MEMORY, AND ARTIFICIAL INTELLIGENCE SYSTEM

TECHNICAL FIELD

The present invention relates to a magnetic multilayer film, a magnetic memory element, a magnetic memory, and an artificial intelligence system.

BACKGROUND ART

Magnetic random access memories (MRAMs) that use a magnetic tunnel junction (MTJ) as a storage element are known as next generation non-volatile magnetic memories that achieve high speed and high rewrite tolerance. As next generation magnetic memory elements using MRAM, spin transfer torque random access memories (STT-MRAMs) that subject magnetic tunnel junctions to magnetization reversal using spin transfer torque and spin-orbit torque magnetic random access memories (SOT-MRAMs) that subject the MTJs to magnetization reversal using spin-orbit torque (see Patent Document 1) have garnered attention.

Among these, the SOT-MRAM element has a configuration in which a heavy metal layer has provided thereon an MTJ having the following three-layer structure: ferromagnetic layer/insulating layer/ferromagnetic layer. SOT-MRAM elements have the property that the resistance of the element is higher in an anti-parallel state in which the magnetization directions of a recording layer and a reference layer are anti-parallel as compared to a parallel state in which the magnetization directions of the recording layer and the reference layer are parallel when using the typically used Co—Fe magnetic body, and data is recorded by associating 0 and 1 with the parallel state and the anti-parallel state, respectively. In SOT-MRAM elements, a spin current is induced when a current is passed through the heavy metal layer as a result of spin-orbit interaction, and the recording layer undergoes magnetization reversal as a result of spins polarized by the spin current flowing into the recording layer. Thus, data can be recorded in SOT-MRAM elements by switching between the parallel state and the anti-parallel state.

Also, in order to achieve high integration, an architecture is proposed for SOT-MRAM elements in which multiple MTJs are arrayed on the heavy metal layer (see Patent Document 1). In the architecture disclosed in Patent Document 1, data is written to the MTJs using a mechanism by which the magnetic anisotropy of the MTJs is controlled by applying voltages to the MTJs. First, a voltage is applied to an MTJ to which data is to be written and the magnetic anisotropy of the recording layer is reduced, thereby setting the recording layer to a state in which the recording layer is susceptible to magnetization reversal (also referred to as a half-selected state). Then, by passing a write current through the heavy metal layer, the recording layer is subjected to magnetization reversal, thereby writing data. Thus, in the magnetic memory disclosed in Patent Document 1, the MTJ to which data is to be written can be selected by applying a voltage to the MTJ.

Electronic neurons using SOT-MRAM elements have also been proposed (see specification of Patent Document 2). In this configuration, the magnetization direction of the neurons is determined by the total synaptic current. A resistive crossbar array functioning as a synapse that generates a bipolar current that is the weighted sum of the input signals is used.

RELATED ART DOCUMENTS

Patent Documents

Patent Document 1: Japanese Patent Application Laid-Open Publication No. 2017-112351
Patent Document 2: US 2017/0330070 A1

SUMMARY OF THE INVENTION

However, using β-W as the heavy metal layer in a SOT-MRAM element presents the problem of high power consumption due to the high electrical resistivity of β-W, and high variability in MTJ characteristics due to a high degree of roughness of β-W. Thus, a suppression of power consumption and a reduction in roughness of the heavy metal layer have been sought.

The present invention takes into consideration the above problem, and an object thereof is to provide a magnetic multilayer film by which power consumption can be suppressed and the roughness of a heavy metal layer can be reduced, a magnetic memory element using the magnetic multilayer film, a magnetic memory, and an artificial intelligence system.

A magnetic multilayer film according to the present invention is a multilayer film for a magnetic memory element including: an amorphous heavy metal layer having a structure in which a first layer containing Hf and a second layer containing a heavy metal excluding Hf are alternately layered; and a recording layer that includes a ferromagnetic layer, a magnetization direction of which can be reversed, and that is adjacent to the heavy metal layer.

A magnetic memory element according to the present invention includes: the above-mentioned magnetic multilayer film; a barrier layer that is adjacent to the recording layer and that is made of an insulator; and a reference layer that is adjacent to the barrier layer, and that has a fixed magnetization direction, wherein the magnetization direction of the ferromagnetic layer of the recording layer can be reversed by a write current passed through the heavy metal layer.

A magnetic memory according to the present invention the above-mentioned magnetic memory element; a writing unit that includes a writing power source that writes data to the magnetic memory element by passing the write current through the heavy metal layer; and a reading unit that includes a read-out power source that passes a read-out current through the barrier layer, and a current detector that detects the read-out current that was passed through the barrier layer and that reads data written to the magnetic memory element. includes:

In the artificial intelligence system according to the present invention, the magnetic memory element described above is used as an electronic neuron to which a weighted sum of a resistive crossbar network is inputted.

According to the present invention, the heavy metal layer is an amorphous layer having a structure in which a first layer containing Hf and a second layer containing a heavy metal excluding Hf are alternately layered, and thus, it is possible to suppress power consumption and to reduce the roughness of the heavy metal layer.

DETAILED DESCRIPTION OF EMBODIMENTS

(1) Embodiment 1

(1-1) Overall Configuration of Magnetic Multilayer Film According to Embodiment 1

Figure 1:
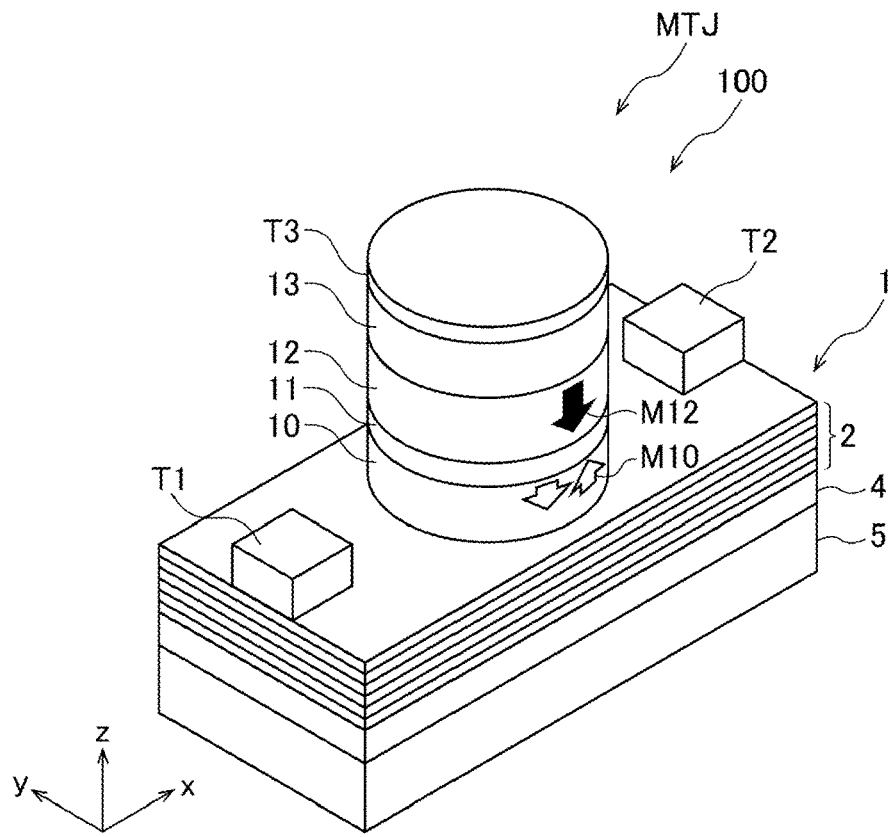
FIG. 1 is a perspective view showing a magnetic memory element according to Embodiment 1 of the present invention.
Figure 2:
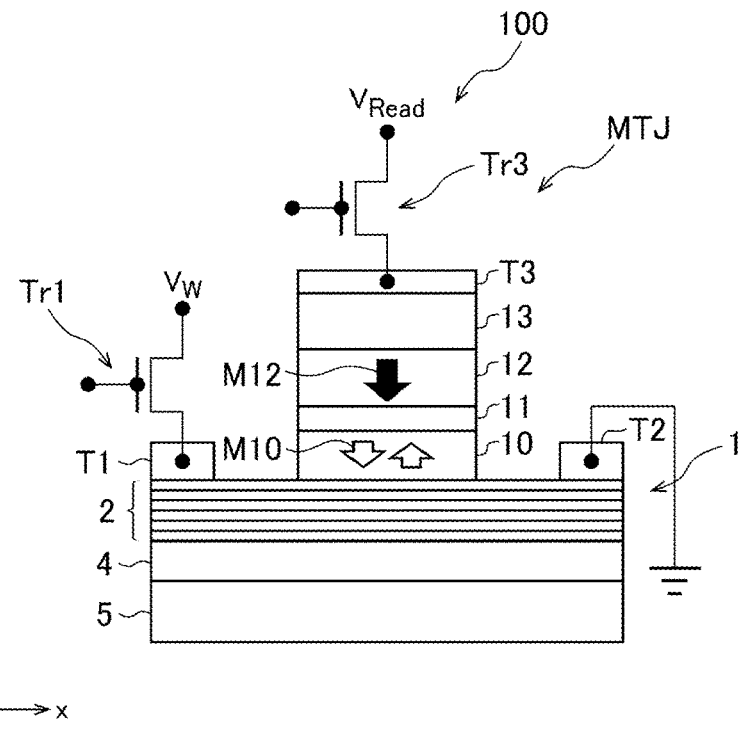
FIG. 2 is a schematic view showing a cross section of the magnetic memory element of FIG. 1 along a plane perpendicular to the y direction.

A magnetic multilayer film 1 according to an embodiment of the present invention will be described below with reference to FIGS. 1 and 2. FIG. 1 is a perspective view of a magnetic memory element 100 produced using the magnetic multilayer film 1. The magnetic memory element 100 is an SOT-MRAM element of a perpendicular magnetization type in which the magnetization direction of a recording layer 10 and a reference layer 12, which are both ferromagnetic layers, is perpendicular to the film surface. In the present specification, as shown in FIG. 1, the lengthwise direction of a heavy metal layer 2 (the direction in which a write current flows as described later) is the x direction (the upper right direction on the page is the +x direction), the widthwise direction is the y direction (in a perspective view, the upper left direction on the page is the +y direction), and the direction perpendicular to the surface of the heavy metal layer 2 is the z direction (the upper direction on the page is the +z direction). Also, FIG. 2 is a schematic view showing a cross section of the magnetic memory element 100 along a plane perpendicular to the y direction. In the present specification, the +z direction is also referred to as upper or upward, for example, and the −z direction is also referred to as lower or downward, for example.

As shown in FIG. 1, the magnetic multilayer film 1 includes the amorphous heavy metal layer 2 having a structure in which first layers containing Hf and second layers containing a heavy metal excluding Hf are alternately layered, and a recording layer 10 provided adjacent to the heavy metal layer 2. In the present embodiment, the heavy metal layer 2 has a rectangular cuboid shape extending along a first direction (x direction) and has a rectangular shape when viewed from above. The thickness (length in the z direction) of the heavy metal layer 2 is 1.4 nm to 9 nm, inclusive, and preferably 1.8 nm to 7 nm, inclusive. The diffusion length of an electron spin is approximately 0.6 to 1.5 nm, and thus, it is preferable that the thickness be 1.8 nm (triple the lower limit of 0.6 nm for the electron spin diffusion length) to 4.5 nm (triple the upper limit of 1.5 nm for the electron spin diffusion length), inclusive. Also, a thickness of six times the spin diffusion length would be too thick not to contribute to spin reversal, and thus, the thickness is 9 nm or less (six times the upper limit of 1.5 nm for the electron spin diffusion length) and more preferably 7 nm or less, which is four to five times the spin diffusion length.

It is preferable that the heavy metal layer 2 have a rectangular shape with a length (x direction length) of 10 nm to 260 nm, inclusive, and a width (y direction length) of 5 nm to 150 nm, inclusive. In the present embodiment, the heavy metal layer 2 is configured such that the y direction width of the heavy metal layer 2 is greater than the width of the recording layer 10, but if manufacturing according to a self-alignment process, it is possible, and more preferable, for the widths to be the same.

Also, it is preferable that the length of the heavy metal layer 2 be as short as possible as long as a current can be passed therethrough, and thus, by doing so, it is possible to increase the density of the magnetic memory when producing the magnetic memory using the magnetic memory elements 100. It is preferable that the width of the heavy metal layer 2 be the same as the width of the MTJ, and doing so allows for maximum write energy efficiency for the magnetic memory element 100 using the magnetic multilayer film 1. Although it is preferable that the shape of the heavy metal layer 2 be as described above, there is no particular limitation. The length of the heavy metal layer 2 is a length that is preferable when one recording layer 10 is provided for the heavy metal layer 2, but if a plurality of recording layers 10 were provided for each heavy metal layer 2 and a plurality of MTJs were arrayed in the first direction, or in other words, if a plurality of magnetic memory elements 100 were to share one heavy metal layer 2, then there is no limitation to the length.

The heavy metal layer 2 is formed of amorphous layers having a structure in which the first layers containing Hf and the second layers containing a heavy metal excluding Hf are alternately layered, and the heavy metal layer 2 is conductive. The second layer contains W (tungsten) or a W alloy, or contains one or more elements selected from among Co, Fe, and B, for example. Also, the layer of the heavy metal layer 2 closest to the recording layer 10 is the first layer, for example. The first layer (also referred to below as the Hf layer) is a thin film made of hafnium (Hf). By forming the heavy metal layer 2 according to the above composition, it is possible to ensure a spin conversion efficiency (spin-Hall angle) ($\theta_{SH}$) equivalent to a β-phase W (β-W) for the heavy metal layer, and magnetization reversal is possible at small current density (Jc). The spin-Hall angle is inversely proportional to the write current density, and thus, when the spin-Hall angle increases, the write current density decreases, thereby improving the write energy efficiency of the magnetic memory element 100 using the magnetic multilayer film 1. The electrical resistivity of the amorphous layer having a structure in which the first layers containing Hf and the second layers containing a heavy metal excluding Hf are alternately layered is 160 to 200 μΩcm, which is lower than the electrical resistivity of a conventional β-W (approximately 210 μΩcm). Thus, it is possible to reduce the voltage drop resulting from the read-out current in the heavy metal layer 2 and mitigate a delay in read-out of the magnetic memory element 100, in addition to being able to reduce power consumption.

In the present embodiment, this heavy metal layer 2 is provided on a substrate 5 made of Si, $SiO_2$, SiN, or the like, for example. One surface of the substrate 5 is provided with a buffer layer 4 made of Ta or the like and having a thickness of 0.5 nm to 7.0 nm, for example. The heavy metal layer 2 is provided adjacent to the buffer layer 4. The substrate 5 may be a circuit board such as a substrate on which FET transistors, metal wiring lines, and the like are formed. In this case, through-holes are formed in the buffer layer 4 to allow contact between the heavy metal layer 2 and the wiring lines formed on the substrate 5, and the like.

The recording layer 10 is formed adjacent to the surface of the heavy metal layer 2 opposite to the surface adjacent to the buffer layer 4. The recording layer 10 is made of a ferromagnetic layer, the magnetization direction of which can be reversed. The thickness of the recording layer 10 is 0.8 nm to 5.0 nm, or preferably 1.0 nm to 3.0 nm. In the present embodiment, the recording layer 10 is formed in a cylindrical shape, but there is no limitation to the shape of the recording layer 10.

The recording layer 10 is a ferromagnetic film made of a ferromagnetic material. In producing the magnetic memory element 100, the material and thickness of the recording layer 10 are selected in consideration of the material and thickness of a barrier layer 11 (to be mentioned later) such that interface magnetic anisotropy is formed in the interface between the recording layer 10 and the barrier layer 11. Thus, the recording layer 10 is magnetized in the direction perpendicular to the film surface (hereinafter referred to as the perpendicular direction) by interface magnetic anisotropy formed in the interface between the recording layer 10 and the barrier layer 11. In FIGS. 1 and 2, the magnetization of the recording layer 10 is depicted with the white arrows as M10, with the directions of the arrows indicating the magnetization directions. The presence of two arrows including an upward arrow and a downward arrow in the recording layer 10 indicates that the magnetization is reversible in the direction perpendicular to the surface of the recording layer 10. In reality, components not facing the magnetization directions (arrow directions) are also included. This similarly applies to other cases below of magnetization being indicated by arrows in the drawings of the specification.

Thus, it is preferable that the recording layer 10 be made of CoFeB, FeB, or CoB in order to generate interface magnetic anisotropy in the recording layer 10. The recording layer 10 can be a multilayer film, and in such a case, a configuration is adopted in which a CoFeB layer, an FeB layer, or a CoB layer is disposed at the interface with the barrier layer 11 made of MgO to be described later, and between the heavy metal layer 2 and the CoFeB layer, the FeB layer, or the CoB layer, a multilayer film including a Co layer such as a Co/Pt multilayer film, a Co/Pd multilayer film, and a Co/Ni multilayer film, and an ordered alloy such as Mn—Ga, Mn—Ge, and Fe—Pt or an alloy including Co such as Co—Pt, Co—Pd, Co—Cr—Pt, Co—Cr—Ta—Pt, CoFeB, FeB, and CoB are inserted. In these multilayer films and alloys, the number of layers, the thickness, and the like are adjusted according to the MTJ size. The recording layer 10 may be a multilayer film in which a ferromagnetic layer and a non-magnetic layer are alternately layered, and a three-layer configuration of ferromagnetic layer/non-magnetic layer/ferromagnetic layer may be adopted, with the magnetizations of the two ferromagnetic layers being coupled by interlayer interaction. In this case, the non-magnetic layer is made of a non-magnetic material such as Ta, W, Mo, Pt, Pd, Ru, Rh, Ir, Cr, Au, Cu, Os, and Re.

Also, the recording layer 10 is magnetized in the perpendicular direction by interface magnetic anisotropy, but the axis of easy magnetization may be generated in the perpendicular direction to cause the recording layer 10 to be magnetized in the perpendicular direction by magnetocrystalline anisotropy or shape magnetic anisotropy. In this case, it is preferable that the recording layer 10 be made of an alloy including at least one of Co, Fe, Ni, or Mn, for example. Specifically, it is preferable that the alloy including Co be an alloy such as Co—Pt, Co—Pd, Co—Cr—Pt, or Co—Cr—Ta—Pt, and in particular, it is preferable that such alloys be Co-rich, signifying that Co is included in a larger quantity than other elements. It is preferable that the alloy including Fe be an alloy such as Fe—Pt or Fe—Pd, and in particular, it is preferable that such alloys be Fe-rich, signifying that Fe is included in a larger quantity than other elements. It is preferable that the alloy including Co and Fe be an alloy such as Co—Fe, Co—Fe—Pt, or Co—Fe—Pd. The alloy including Co and Fe may be Co-rich or Fe-rich. It is preferable that the alloy including Mn be an alloy such as Mn—Ga or Mn—Ge. An element such as B, C, N, O, P, Al, or Si may be included in some quantity in the abovementioned alloy including at least one of Co, Fe, Ni, or Mn.

Formation of the MgO (100) barrier layer 11 adjacent to the recording layer 10 is facilitated by the property that when MgO is layered on an amorphous metal layer, an MgO layer in which a single crystal oriented in the (100) direction is dominant is formed, and the recording layer 10 may be an amorphous layer. By doing so, it is possible to grow, by a large grain, the barrier layer 11 made of MgO (100) as a (100) highly oriented film in the in-plane direction on the ferromagnetic material, enabling the in-plane uniformity of the orientation of the MgO (100) to be improved and for the uniformity in the resistance change rate (MR change rate) to be improved.

The Hf layer forming the heavy metal layer 2 may include zirconium (Zr). The recording layer 10 is formed adjacent to the Hf layer, and thus, it is possible to mitigate an increase in the saturation magnetization Ms of the ferromagnetic layer 18 due to heat treatment, and thus, it is possible to mitigate an increase in writing current density and thereby to improve the write energy efficiency of the recording layer 10. The magnetization of the recording layer 10 is reduced by forming the same adjacent to the Hf layer, and thus, the size of the diamagnetic field is reduced, the perpendicular magnetization anisotropy is increased, and it is easier to perform magnetization in the perpendicular direction. Also, an increase in surface magnetic anisotropy constant was observed at the heavy metal layer 2/CoFeB interface of the present working example as will be described later. Thus, it is possible to perform perpendicular magnetization even in areas of the recording layer 10 that have greater thickness, thereby improving thermal stability of the recording layer 10. It is preferable that the Hf layer be formed to a thickness of 0.2 nm to 0.7 nm, inclusive, and more preferably 0.3 nm to 0.7 nm, inclusive. To form the Hf layer as a layer, 0.2 nm of thickness is required, and if the thickness of the Hf layer were set to be greater than 0.7 nm, the rate of rise in spin-Hall angle would be saturated, which means that the write energy efficiency would not greatly improve. The heavy metal layer 2 has a structure in which an Hf layer with a thickness of 0.35 nm and a second layer with a thickness of 0.35 nm are alternately layered for two to ten iterations. In the case of two iterations of alternate layering, the thickness of the heavy metal layer 2 would be 1.4 nm. In the case of ten iterations of alternate layering, the thickness of the heavy metal layer 2 would be 7.0 nm. Alternatively, the heavy metal layer 2 has a structure in which an Hf layer with a thickness of 0.7 nm and a second layer with a thickness of 0.7 nm are alternately layered for one to seven iterations. In the case of one iteration of alternate layering, the thickness of the heavy metal layer 2 would be 1.4 nm. In the case of five iterations of alternate layering, the thickness of the heavy metal layer 2 would be 7.0 nm. There is no limit on the thickness of portions of the heavy metal layer other than Hf as long as the crystalline structure thereof is within a thickness range that allows maintenance of amorphousness, and it is preferable that the thickness be 3 nm or less, and more preferably 1 nm or less. In the case of W, for example, it was confirmed that amorphousness was maintained even with (Hf 0.3 nm/W 3 nm)n.

If the recording layer 10 is made of a ferromagnetic material including B (boron), then the Hf layer exhibits the greatest effect when made of CoFeB, FeB, or CoB, or is made of a ferromagnetic material including the aforementioned alloys. If the recording layer 10 has a multilayer structure, then it is preferable that the Hf layer and the adjacent ferromagnetic layer, among the layers constituting the recording layer 10, be made of CoFeB, FeB, or CoB.

In the present embodiment, the magnetic multilayer film 1 is formed by employing a typical film deposition method such as physical vapor deposition (PVD) to form the buffer layer 4, the heavy metal layer 2, and the recording layer 10 in the stated order on the substrate 5. The heavy metal layer 2 is formed by alternately layering the Hf layer and the second layer (e.g., the W layer) having prescribed thicknesses. The multilayer film constituted of the Hf layer/second layer is an amorphous film formed by heat treatment performed when manufacturing the magnetic memory element 100 to be described later. Changing the thicknesses of the tungsten film and the tantalum film as appropriate, changing the composition of the target, or changing the film deposition rate are matters that could be adjusted as appropriate. Although the term "film" is used for ease of explanation, the film not necessarily be formed on the entire surface. Also, the recording layer 10 is formed by the publicly known lithography technique.

(1-2) Magnetic Memory Element Using Multilayer Film According to Embodiment 1

Next, the magnetic memory element 100 using the magnetic multilayer film 1 according to Embodiment 1 will be described with reference to FIGS. 1 and 2. The magnetic memory element 100 is of an SOT-MRAM element type including an MTJ that is adjacent to the heavy metal layer 2 and that has the recording layer 10 of the magnetic multilayer film 1, the barrier layer 11, and the reference layer 12. In the present embodiment, the MTJ has a cylindrical shape to match the shape of the recording layer 10, but there is no limitation on the shape of the MTJ.

The heavy metal layer 2 and the recording layer 10 of the magnetic memory element 100 were described above, and thus, description thereof is omitted here. The barrier layer 11 is formed adjacent to the recording layer 10. It is preferable that the barrier layer 11 be made of an insulator such as MgO, $Al_2O_3$, AlN, or MgAlO, and in particular, MgO. The thickness of the barrier layer 11 is 0.1 nm to 2.5 nm, or preferably 0.5 nm to 1.5 nm.

The reference layer 12 has a single layer structure in the drawings, but is not limited to this configuration, and can have a three-layer laminated ferri structure constituted of a three-layer multilayer film in which a ferromagnetic layer, a non-magnetic layer, and a ferromagnetic layer are layered in the stated order, for example. In this case, the direction of magnetization of the one ferromagnetic layer is anti-parallel to the direction of magnetization of the other ferromagnetic layer. The magnetization of one ferromagnetic layer faces the −z direction and the magnetization of the other ferromagnetic layer faces the +z direction. In the present specification, where the magnetization directions are anti-parallel, the magnetization directions are substantially 180 degrees apart, where the magnetization direction is the +z direction, the direction is referred to as upward, and where the magnetization direction is the −z direction, the direction is referred to as downward.

Also, in the present embodiment, the material and thickness of the ferromagnetic layer, of the reference layer 12, closest to the barrier layer 11 are selected such that interface magnetic anisotropy occurs at the interface between the barrier layer 11 and the ferromagnetic layer, of the reference layer 12, closest to the barrier layer 11. As a result, the magnetization direction of the ferromagnetic layer, of the reference layer 12, closest to the barrier layer 11 is the direction perpendicular to the film surface. By employing the laminated ferri structure for the reference layer 12 and performing antiferromagnetic coupling of the magnetization of one of the ferromagnetic layers of the reference layer 12 and the magnetization of the other ferromagnetic layer, the magnetization of the one ferromagnetic layer of the reference layer 12 is fixed to be perpendicular to the magnetization of the other ferromagnetic layer. In this manner, the magnetization of the reference layer 12 is fixed to the perpendicular direction. The magnetization of one ferromagnetic layer of the reference layer 12 and the magnetization of the other ferromagnetic layer may have fixed magnetization directions through antiferromagnetic coupling by interlayer interaction.

In the present embodiment, the magnetization M12 of the reference layer 12 is fixed to be downward but is not limited thereto. The magnetization M12 of the reference layer 12 may be fixed to be upward. If using the laminated ferri structure for the reference layer 12 as described above, a configuration may be adopted in which the magnetization of one ferromagnetic layer of the reference layer 12 is fixed to be downward and the magnetization of the other ferromagnetic layer is fixed to be upward. Alternatively, the magnetization of one ferromagnetic layer of the reference layer 12 may be fixed to be upward and the magnetization of the other ferromagnetic layer may be fixed to be downward. Additionally, the directions of the magnetization of the one ferromagnetic layer and the magnetization of the other ferromagnetic layer may be fixed to the perpendicular direction by setting the magnetization directions of the one ferromagnetic layer and the other ferromagnetic layer of the reference layer 12 to be the perpendicular direction through magnetocrystalline anisotropy or shape magnetic anisotropy, and by antiferromagnetically coupling the magnetization of the one ferromagnetic layer to the magnetization of the other ferromagnetic layer through interlayer interaction to fix the magnetization directions.

The one ferromagnetic layer and the other ferromagnetic layer of the reference layer 12 can be made of a material similar to the recording layer 10, and the non-magnetic layer forming the reference layer 12 can be made of Ir, Rh, Ru, Os, or Re, or of alloys thereof such as RuIr, RuRh, or RuFe. The non-magnetic layer is formed to a thickness of 0.4 nm to 1.0 nm in the case of Ru, 0.4 nm to 0.7 nm in the case of Ir, 0.7 nm to 1.0 nm in the case of Rh, 0.75 nm to 1.2 nm in the case of Os, and 0.5 nm to 0.95 nm in the case of Re. As an example, the reference layer 12 is provided with a configuration with the following layers: for the one ferromagnetic layer, CoFeB (1.2 nm)/W (0.3 nm)/Co (0.5 nm)/(Pt (0.8 nm)/Co (0.25 nm))$_3$/(Pt (0.25 nm)/Co (0.5 nm))$_2$ from the barrier layer 11 side; for the non-magnetic layer, Ru (0.85 nm); and for the other ferromagnetic layer, Co (0.5 nm)/(Pt (0.25 nm/Co (0.5 nm))$_7$ from the non-magnetic layer side. By using Co—Fe—B for the one ferromagnetic layer, it is possible to set the magnetization direction of the one ferromagnetic layer to be the perpendicular direction by interface magnetic anisotropy. The "$_3$" after the parentheses in "(Pt (0.8 nm)/Co (0.25 nm))$_3$" refers to the two-layer structure of Pt (0.8 nm)/Co (0.25 nm) being layered three times (to form a total of six layers). This similarly applies to the "$_2$" in "(Pt (0.25 nm)/Co (0.5 nm)$_2$" and the "$_7$" in "(Pt (0.25 nm)/Co (0.5 nm))$_7$."

The one ferromagnetic layer may, as described above, have a three-layer structure in which the barrier layer 11 has formed thereon a ferromagnetic layer (approximately 0.6 nm to 2.0 nm) constituted of CoFeB, FeB, CoB, or the like; a non-magnetic layer (1.0 nm or less) including Ta, W, or Mo; and a ferromagnetic layer in the stated order, for example. The ferromagnetic layers above and below the non-magnetic layer are ferromagnetically coupled by interlayer interaction. The one ferromagnetic layer is constituted of the following layers, for example: a ferromagnetic layer of Co—Fe—B (1.5 nm); a non-magnetic layer of Ta (0.5 nm); and a ferromagnetic layer that is a crystalline ferromagnetic layer or the like having perpendicular magnetic anisotropy. According to this configuration, it is possible to set the magnetization direction of the ferromagnetic layer to be the perpendicular direction, the magnetization direction of the ferromagnetic layer facing the aforementioned ferromagnetic layer across the non-magnetic layer to also be the perpendicular direction, and the magnetization direction of the one ferromagnetic layer to be the perpendicular direction.

A cap layer 13 is a layer of approximately 1.0 nm in thickness made of a conductive material such as Ta, for example, and is formed adjacent to the reference layer 12. The magnetic memory element 100 may not have the cap layer 13. Also, the cap layer 13 may be made of a non-magnetic layer such as MgO. In this case, the configuration is set such that a tunnel current flows through the cap layer 13 and a current flows from a third terminal T3 to the reference layer 12, for example.

This magnetic memory element 100 is formed by employing a typical film deposition method such as physical vapor deposition (PVD) to form the barrier layer 11, the reference layer 12, and the cap layer 13 in the stated order on the recording layer 10 of the magnetic multilayer film 1, and subjecting the same to heat treatment at a temperature of 300° C. to 400° C. The recording layer 10, the barrier layer 11, the reference layer 12, and the cap layer 13 may be formed in the stated order on the entire surface of the heavy metal layer 2, with the MTJ then being molded by lithography or the like.

Also, the magnetic memory element 100 has connected thereto three terminals (first terminal T1, second terminal T2, third terminal T3) for applying a voltage or passing a current to perform the writing operation or the reading operation. The magnetic memory element 100 is a three-terminal element. The first terminal T1, the second terminal T2, and the third terminal T3 are members made of a conductive metal such as Cu, Al, W, or Au, for example, and there is no particular limitation on the shape thereof.

The first terminal T1 and the second terminal T2 are provided at the first end and the second end of the heavy metal layer 2 such that the MTJ is disposed between the terminals. In the present embodiment, the first terminal T1 is provided on the surface of the first end of the heavy metal layer 2 in the first direction, and the second terminal T2 is provided on the surface of the second end of the heavy metal layer 2 in the first direction. The first terminal T1 is connected to a FET-type first transistor Tr1, and the second terminal T2 is connected to ground. In the first transistor Tr1, the drain is connected to the first terminal T1, the source is connected to a first bit line and is connected to a writing power source that supplies a write voltage $V_W$, and the gate is connected to a word line, for example.

The voltage level of the writing power source can be set to the write voltage $V_W$ via the first bit line, and by setting the first transistor Tr1 to be ON, the write voltage $V_W$ can be applied to the first terminal T1, causing a write current $I_W$ based on the value of the write voltage $V_W$ between the first terminal T1 and the second terminal T2 to flow. By setting the value of the write voltage $V_W$ to be higher than ground, the write current $I_W$ flows from the first terminal T1 to the second terminal T2, and by setting the value of the write voltage $V_W$ to be lower than ground, the write current $I_W$ flows from the second terminal T2 to the first terminal T1. In this manner, the first terminal T1 and the second terminal T2 are connected to (the first end and the second end of) the heavy metal layer 2, and pass the write current $I_W$ to the heavy metal layer 2, causing the magnetization direction of the recording layer 10 to be reversed.

The third terminal T3 is provided on the cap layer 13 in contact therewith. In the present embodiment, the third terminal T3 is a cylindrical thin film, the in-plane cross-sectional shape of which is the same circular shape as the MTJ, is disposed on the top surface of the MTJ (cap layer 13), covers the entire top surface, and is electrically connected to the reference layer 12 via the cap layer 13. Also, in the present embodiment, a FET-type third transistor Tr3 is connected to the third terminal T3. In the third transistor Tr3, the drain is connected to the third terminal T3, the source is connected to a second bit line and is connected to a read-out power source that supplies a read-out voltage $V_{Read}$, and the gate is connected to a read-out voltage line, for example. The read-out power source can set the voltage level to the read-out voltage $V_{Read}$ via the second bit line, and by turning ON the third transistor Tr3, it is possible to apply the read-out voltage $V_{Read}$ to the third terminal T3.

By turning ON the first transistor Tr1 and the third transistor Tr3, a read-out current Jr for reading the resistance of the MTJ according to the potential difference between the first terminal T1 and the third terminal T3 flows between the first terminal T1 and the third terminal T3. By setting $V_W$ to greater than $V_{Read}$, it is possible to pass the read-out current Jr from the first terminal T1 to the third terminal T3 via the heavy metal layer 2 and the MTJ.

In the present embodiment, the first terminal T1 and the second terminal T2 are provided above the heavy metal layer 2 (surface on which the MTJ is provided), with contact to the magnetic memory element 100 being made from above, but the configuration is not limited thereto. For example, a configuration may be adopted in which the first terminal T1 and the second terminal T2 are provided adjacent to the buffer layer 4 provided below the heavy metal layer 2 (adjacent to the surface on the rear side of the surface on which the MTJ is provided), with contact to the magnetic memory element 100 being made from below. Additionally, a configuration may be adopted in which the second terminal T2 is connected not to the ground but rather to a third bit line via the second transistor Tr2, for example, and the direction of the writing current $I_W$ is changed according to the potential difference between the first terminal T1 connected to the first bit line and the second terminal T2. In this case, the first bit line is set to a high level, the third bit line is set to a low level, the potential of the first terminal T1 is set to be higher than the potential of the second terminal T2, and the write current $I_W$ is passed from the first terminal T1 to the second terminal T2, for example. Also, the first bit line is set to a low level, the third bit line is set to a high level, the potential of the second terminal T2 is set to be higher than the potential of the first terminal T1, and the write current $I_W$ is passed from the second terminal T2 to the first terminal T1. By setting the second transistor Tr2 to be OFF during read-out, the read-out current can be prevented from flowing to the second terminal T2.

(1-3) Writing Method and Reading Method for Magnetic Memory Element

The writing method for this magnetic memory element 100 will be described with reference to FIGS. 3, 4, 5, and 6, which have the same reference characters assigned for the same components in FIG. 1. In the magnetic memory element 100, the resistance of the MTJ changes according to whether the magnetization directions of the recording layer 10 and the reference layer 12 are parallel or anti-parallel. If the reference layer 12 is a multilayer film, then the resistance of the MTJ changes according to whether the magnetization direction of the recording layer 10 and the magnetization direction of the ferromagnetic layer of the reference layer 12 in contact with the barrier layer 11 are parallel or anti-parallel. Also, if the recording layer 10 is also a multilayer film, then the resistance of the MTJ changes according to whether the magnetization direction of the ferromagnetic layer in contact with the barrier layer 11 of the recording layer 10 and the magnetization direction of the ferromagnetic layer in contact with the barrier layer 11 of the reference layer 12 are parallel or anti-parallel.

In the present specification, if the recording layer 10 and the reference layer 12 are in a parallel state, then the recording layer 10 and the reference layer 12 are multilayer films, and the magnetization direction of the ferromagnetic layer in contact with the barrier layer 11 of the recording layer 10 and the magnetization direction of the ferromagnetic layer in contact with the barrier layer 11 of the reference layer 12 also include a parallel state. Also, if the recording layer 10 and the reference layer 12 are in an anti-parallel state, then the recording layer 10 and the reference layer 12 are multilayer films, and the magnetization direction of the ferromagnetic layer in contact with the barrier layer 11 of the recording layer 10 and the magnetization direction of the ferromagnetic layer in contact with the barrier layer 11 of the reference layer 12 are in an anti-parallel state.

Data is stored in the magnetic memory element 100 by relying on the principle that the resistance of the MTJ differs between the parallel state and the anti-parallel state, and 1-bit data of "0" and "1" are respectively allocated to the parallel state and the anti-parallel state. In the magnetic memory element 100, the magnetization direction of the recording layer 10 can be reversed, and thus, by reversing the magnetization direction of the recording layer 10, the magnetization state of the MTJ is switched between the parallel state and the anti-parallel state, and "1" is stored in an MTJ that has stored "0" (hereinafter referred to as a "bit") and "0" is stored in a bit that has stored "1." In the present specification, reversing the magnetization direction of the recording layer 10 to change the resistance of the MTJ is also referred to as writing data.

The writing method for the magnetic memory element 100 will be described more specifically. In the present embodiment, the heavy metal layer 2 is formed of amorphous layers having a structure in which the first layers containing Hf and the second layers containing a heavy metal excluding Hf are alternately layered, and less than half full elements such as Hf, Ta, W, Re, and Os or alloys thereof have a negative spin Hall angle. An example in which the spin Hall angle of the heavy metal layer 2 is negative will be described as an example. It is assumed that a magnetic field generation device (not shown) can apply an external magnetic field $H_0$ in the x direction (lengthwise direction of the heavy metal layer 2).

Figure 3:
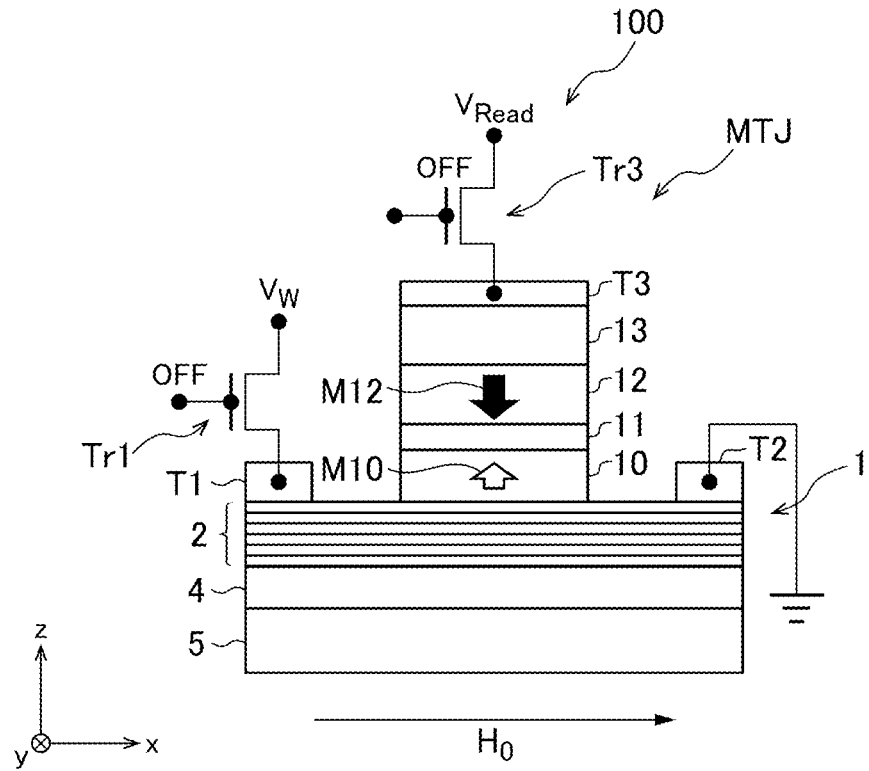
FIG. 3 is a schematic cross-sectional view showing a method for writing "0" to a magnetic memory element that has stored therein "1", and shows an initial state.

First, an example will be described in which "0" is written to the magnetic memory element 100, which has "1" stored therein. In this case, as shown in FIG. 3, in the initial state the magnetic memory element 100 stores "1," the magnetization direction of the recording layer 10 is upward, the magnetization direction of the ferromagnetic layer in contact with the barrier layer 11 of the reference layer 12 is downward, and the MTJ is in an anti-parallel state. Also, the first transistor Tr1 and the third transistor Tr3 are set to be OFF. First, the external magnetic field $H_0$ is applied in the +x direction as shown in FIG. 3.

Figure 4:
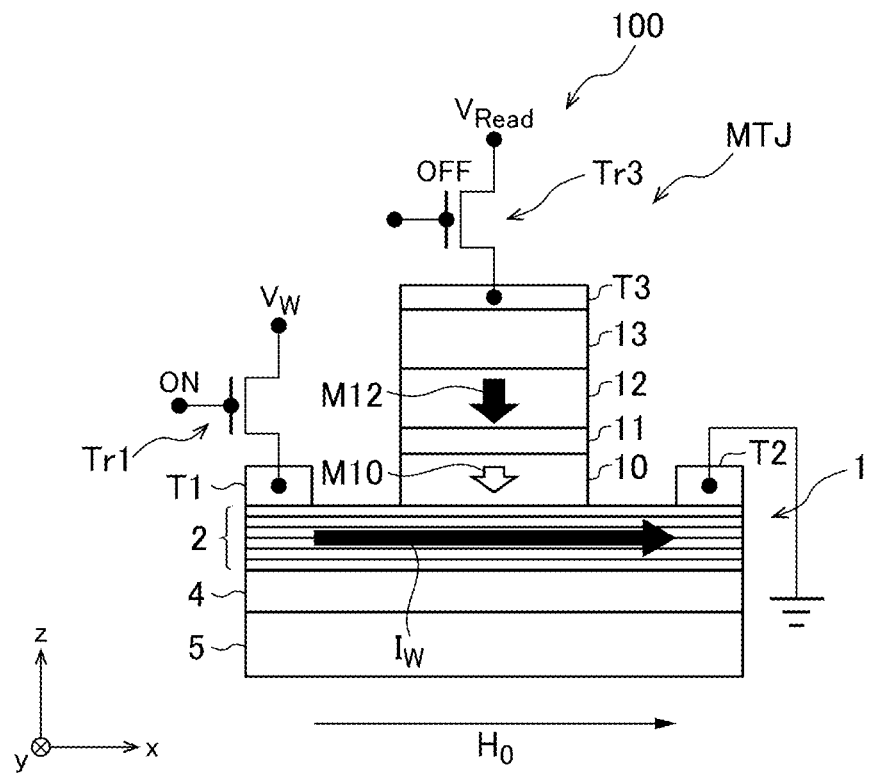
FIG. 4 is a schematic cross-sectional view showing a method for writing "0" to a magnetic memory element that has stored therein "1", and shows a state in which the data was written by passing the write current.

Next, as shown in FIG. 4 (FIG. 4 shows the magnetization direction of the recording layer 10 after writing was performed), the first transistor Tr1 is set to be ON, and the write voltage $V_W$ is applied to the first terminal T1. At this time, the write voltage $V_W$ is set to be higher than the ground voltage, and thus, the write current $I_W$ flows from the first terminal T1 to the second terminal T2 via the heavy metal layer 2, and the write current $I_W$ flows in the +x direction from the first end to the second end of the heavy metal layer 2. The third transistor Tr3 is OFF, and thus, no current flows from the first terminal T1 to the third transistor T3 via the MTJ. In the present embodiment, the write current $I_W$ flows between the first end and the second end of the heavy metal layer 2. The write current $I_W$ is a pulse current, and by adjusting the time that the first transistor Tr1 is ON, the pulse width can be changed.

When the write current $I_W$ flows in the heavy metal layer 2, a spin current (flow of spin angular momentum) is generated by the spin Hall effect due to the spin-orbit interaction in the heavy metal layer 2, a spin towards the front of the page (−y direction in FIG. 1) flows to the upper surface side (+z direction) of the heavy metal layer 2, a spin that is anti-parallel to the direction of the aforementioned spin and that is oriented towards the rear of the page (+y direction in FIG. 1) flows towards the lower surface side (−z direction) of the heavy metal layer 2, and a spin is unevenly distributed in the heavy metal layer 2. As a result of the spin current flowing in the heavy metal layer 2, the spin facing the −y direction flows into the recording layer 10.

At this time, in the ferromagnetic layer of the recording layer 10, the spin that is flowing in causes the magnetization M10 to be subjected to a +x direction torque, the magnetization M10 rotates in the +x direction due to the torque, and the upward magnetization M10 reverses to face downward and the MTJ enters the parallel state. At this time, the external magnetic field $H_0$ is applied in the +x direction, and thus, the torque resulting from the spin is canceled out by the external magnetic field $H_0$, the magnetization M10 does not rotate anymore, and the magnetization M10 faces the −z direction. Then, by stopping the write current by turning OFF the first transistor Tr1, the magnetization M10 is fixed in the −z direction and "0" is stored as data.

Next, an example will be described in which "1" is written to the magnetic memory element 100, which has "0" stored therein.

Figure 5:
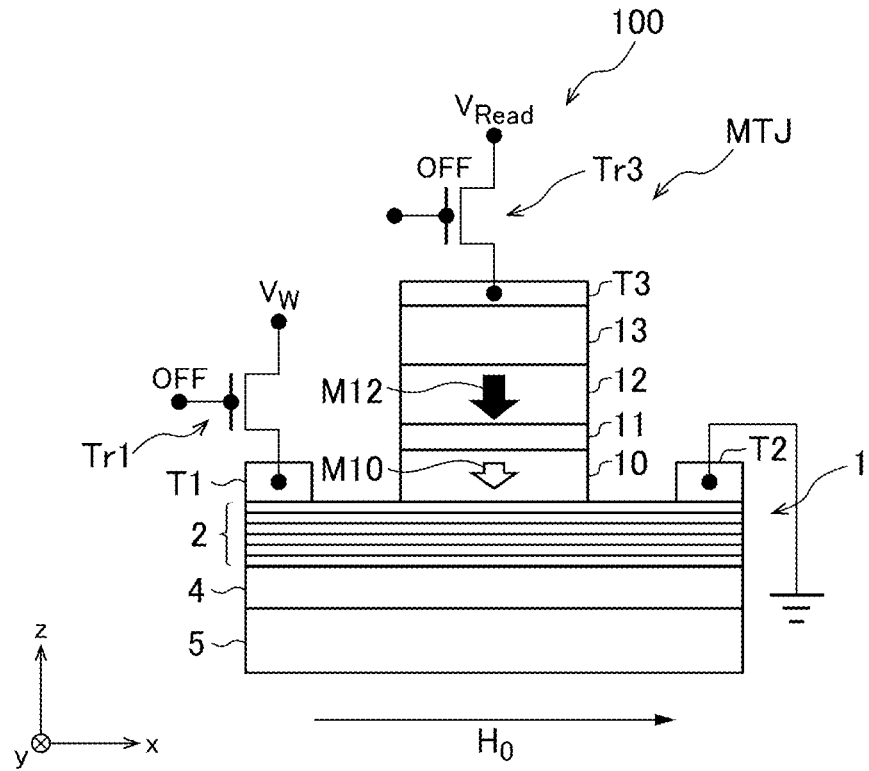
FIG. 5 is a schematic cross-sectional view showing a method for writing "1" to a magnetic memory element that has stored therein "0", and shows an initial state.

In this case, in the initial state the magnetic memory element 100 stores "0," the magnetization direction of the recording layer 10 is downward, the magnetization direction of the ferromagnetic layer in contact with the barrier layer 11 of the reference layer 12 is downward, and the MTJ is in a parallel state. Also, the first transistor Tr1 and the third transistor Tr3 are set to be OFF. First, the external magnetic field $H_0$ is applied in the +x direction as shown in FIG. 5.

Figure 6:
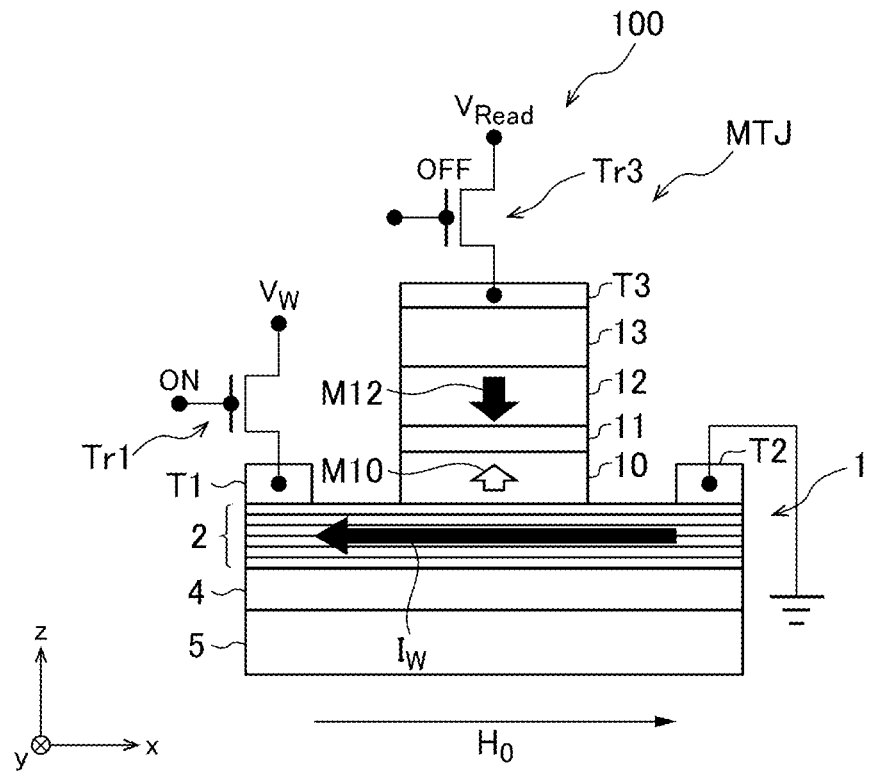
FIG. 6 is a schematic cross-sectional view showing a method for writing "1" to a magnetic memory element that has stored therein "0", and shows a state in which the data was written by passing the write current.

Next, as shown in FIG. 6 (FIG. 6 shows the magnetization direction of the recording layer 10 after writing was performed), the first transistor Tr1 is set to be ON, and the write voltage $V_W$ is applied to the first terminal T1. At this time, the write voltage $V_W$ is set to be lower than the ground voltage, and thus, the write current $I_W$ flows from the second terminal T2 to the first terminal T1 via the heavy metal layer 2, and the write current $I_W$ flows in the −x direction from the first end to the second end of the heavy metal layer 2.

When the write current $I_W$ flows in the heavy metal layer 2, a spin current (flow of spin angular momentum) is generated by the spin Hall effect due to the spin-orbit interaction in the heavy metal layer 2, a spin towards the rear of the page (+y direction in FIG. 1) flows to the upper surface side (+z direction) of the heavy metal layer 2, a spin that is anti-parallel to the direction of the aforementioned spin and that is oriented towards the front of the page (−y direction in FIG. 1) flows towards the lower surface side (−z direction) of the heavy metal layer 2, and a spin is unevenly distributed in the heavy metal layer 2. As a result of the spin current flowing in the heavy metal layer 2, the spin facing the +y direction flows into the recording layer 10.

At this time, in the ferromagnetic layer of the recording layer 10, the spin that is flowing in causes the magnetization M10 to be subjected to a −x direction torque, the magnetization M10 rotates in the −x direction due to the torque, and the downward magnetization M10 reverses to face upward and the MTJ enters the anti-parallel state. At this time, the external magnetic field $H_0$ is applied in the +x direction, and thus, the torque resulting from the spin is canceled out by the external magnetic field $H_0$, the magnetization M10 does not rotate anymore, and the magnetization M10 faces the +z direction. Then, by stopping the write current by turning OFF the first transistor Tr1, the magnetization M10 is fixed in the +z direction and "1" is stored as data. In this manner, by passing a write current $I_W$ through the heavy metal layer 2, the recording layer 10 is subjected to magnetization reversal, thereby enabling rewriting of data.

In this manner, in the magnetic memory element 100, it is possible to reverse the magnetization direction of the recording layer 10 of the MTJ by passing the write current $I_W$ between the first end and the second end of the heavy metal layer 2, thereby writing "0" or "1" as data.

The magnetic memory element 100 may be configured such that a voltage is applied between the first end (first terminal T1) and the second end (second terminal T2) of the heavy metal layer 2 to pass a write current through the heavy metal layer 2, and a voltage is applied to the MTJ via the third terminal T3 to reduce the magnetic anisotropy of the ferromagnetic layer of the recording layer 10, thereby reversing the magnetization M10 of the recording layer 10 through a spin transferred from the heavy metal layer 2.

Also, in the example above, an example was described in which a magnetic field generation device applies the external magnetic field $H_0$ in the x direction (lengthwise direction of the heavy metal layer 2), but the configuration is not limited thereto. The external magnetic field generation device can be omitted by adjusting the above-mentioned voltage application method or the shape of the MTJ to be described later.

Figure 7:
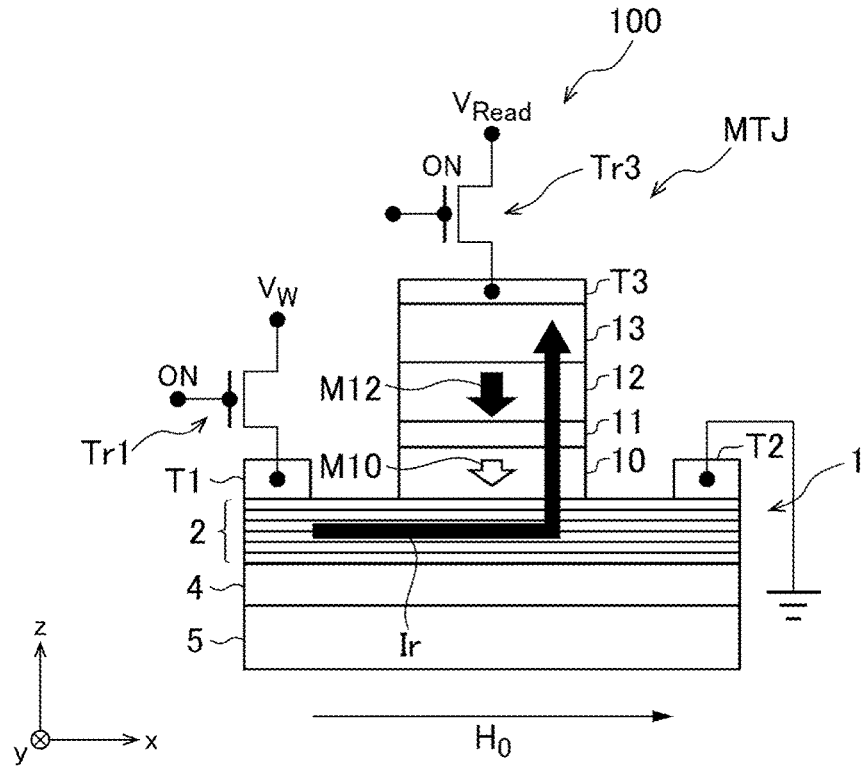
FIG. 7 is a schematic cross-sectional view showing a method for reading data stored in the magnetic memory element.

Next, the reading method will be described with reference to FIG. 7. At this time, in the initial state, all transistors are set to be OFF. First, the write voltage $V_W$ is set higher than the read-out voltage $V_{Read}$. Next, reading is performed by turning ON the first transistor Tr1 and the third transistor Tr3, applying the write voltage $V_W$ to the first terminal T1, and applying the read-out voltage $V_{Read}$ to the third terminal T3. At this time, the write voltage $V_W$ is set higher than the read-out voltage $V_{Read}$, and thus, the read-out current $I_r$ flows from the first terminal T1 to the heavy metal layer 2, the recording layer 10, the barrier layer 11, the reference layer 12, the cap layer 13, and the third terminal T3 in the stated order. The read-out current $I_r$ flows through the barrier layer 11. The read-out current $I_r$ is detected by a current detector (not shown). The value of the read-out current $I_r$ changes according to the resistance of the MTJ, and thus, according to the value of the read-out current $I_r$, it is possible to determine whether the MTJ is in the parallel state or the anti-parallel state, or in other words, to read whether the MTJ stores "0" or "1" as data. The read-out current $I_r$ is a pulse current, and by adjusting the time that the third transistor Tr3 is ON, the pulse width can be adjusted.

It is preferable that the read-out current $I_r$ be set to a weak enough current that when the read-out current $I_r$ flows through the MTJ, the recording layer 10 is not subjected to spin transfer magnetization reversal due to the read-out current $I_r$. By adjusting as appropriate the potential difference between the write voltage $V_W$ and the read-out voltage $V_{Read}$, the value of the read-out current $I_r$ is adjusted. Also, it is preferable that the third transistor Tr3 be turned ON to turn ON the read-out voltage $V_{Read}$ after turning ON the first transistor Tr1 to turn ON the write voltage $V_W$. By doing so, it is possible to mitigate the flow of current from the third terminal T3 to the second terminal T2 via the MTJ, and it is possible to mitigate the flow of current other than the read-out current through the MTJ.

Then, after turning OFF the third transistor Tr3, the first transistor Tr1 is turned OFF. By turning OFF the first transistor Tr1 after the third transistor Tr3, or in other words, by turning OFF the write voltage $V_W$ after the read-out voltage $V_{Read}$, it is possible to mitigate the flow of a current based on the potential difference between the read-out voltage $V_{Read}$ and ground voltage from the third terminal T3 to the second terminal T2 via the MTJ and the heavy metal layer 2. Thus, the magnetic memory element 100 can protect the barrier layer 11, further reduce the thickness of the barrier layer 11, and furthermore mitigate read disturbance in which the magnetization state of the recording layer 10 is changed by a current flowing through the MTJ.

(1-4) Actions and Effects

As described above, the magnetic multilayer film 1 of Embodiment 1 is a multilayer film for a magnetic memory element and includes the amorphous heavy metal layer having a structure in which first layers containing Hf and second layers containing a heavy metal excluding Hf are alternately layered, and a recording layer that includes ferromagnetic layers, the magnetization directions of which can be reversed, and that is adjacent to the heavy metal layer.

Thus, in the magnetic multilayer film 1, the heavy metal layer 2 is constituted of amorphous layers having a structure in which the first layers containing Hf and the second layers containing a heavy metal excluding Hf are alternately layered, and therefore, it is possible to set the electrical resistivity of the heavy metal layer to be lower than β-W and suppress power consumption. Also, it is possible to reduce the roughness of the heavy metal layer to less than β-W and to mitigate variation in MTJ characteristics.

VERIFICATION EXPERIMENT (Creation of Working Example Sample and Comparison Example Sample)

Figure 8:
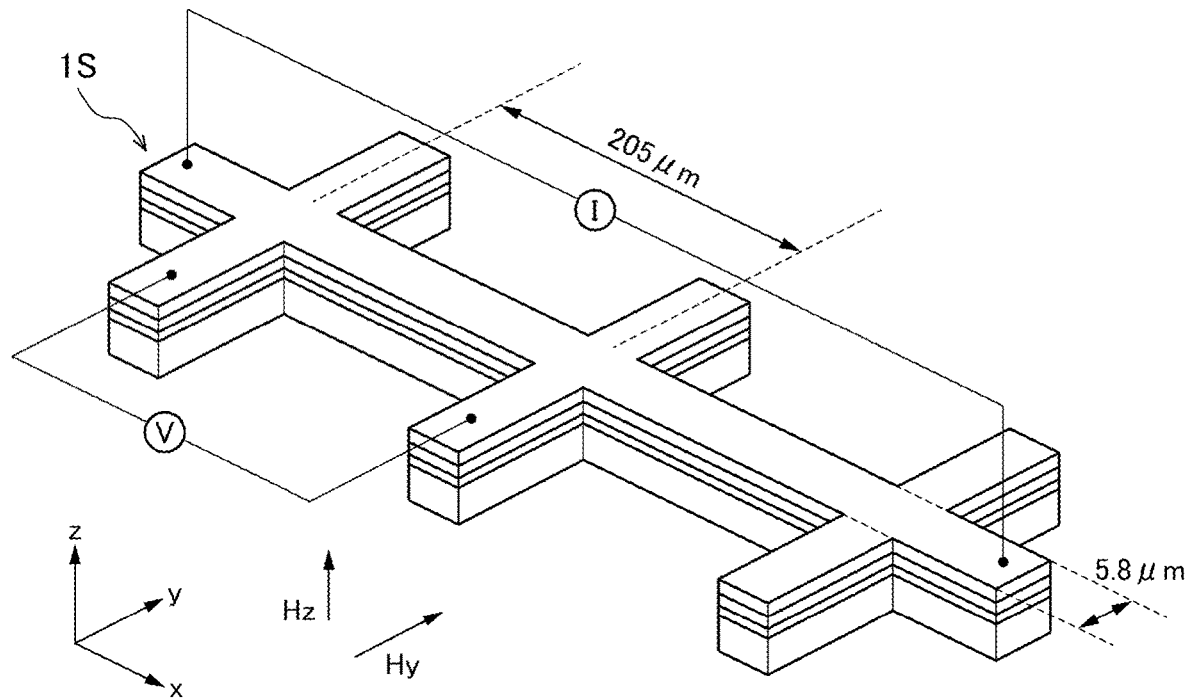
FIG. 8 is a schematic perspective view showing a configuration of a sample to be subjected to a verification experiment.

Below, in order to perform the verification experiment described below, a sample having a magnetic multilayer film 1s configured as shown in FIG. 8 was created. The magnetic multilayer film 1S is a film in which the substrate 5, the buffer layer 4, the heavy metal layer 2, the recording layer 10, the barrier layer 11, and the conductive layer 20 are layered, and has an x-direction extension section and three y-direction extension sections intersecting therewith. The width of each section is 5.8 μm, and the interval (pitch) of the plurality of y-direction extension sections is 205 μm. As shown in FIG. 8, when applying an external magnetic field, a y-direction magnetic field Hy or a z-direction magnetic field Hz is applied. A current was passed between both ends of the x-direction extension section and a prescribed voltage V was measured at ends of prescribed locations of the y-direction extension sections at the center and the ends.

Figure 9:
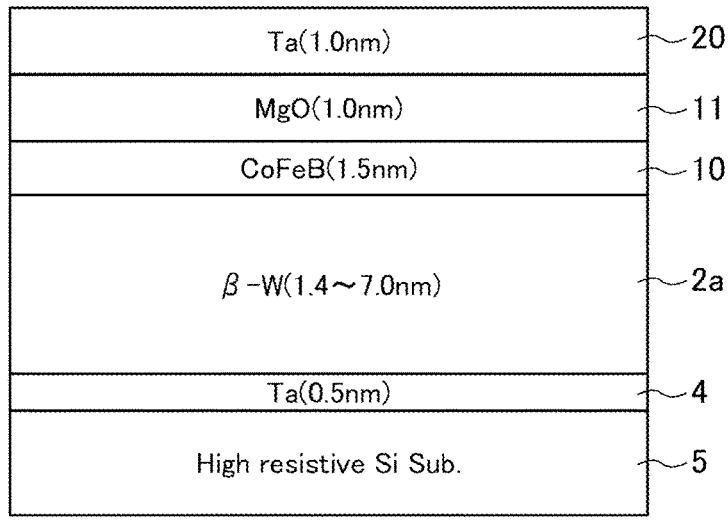
FIG. 9 is a schematic cross-sectional view of a sample according to a comparison example.
Figure 10:
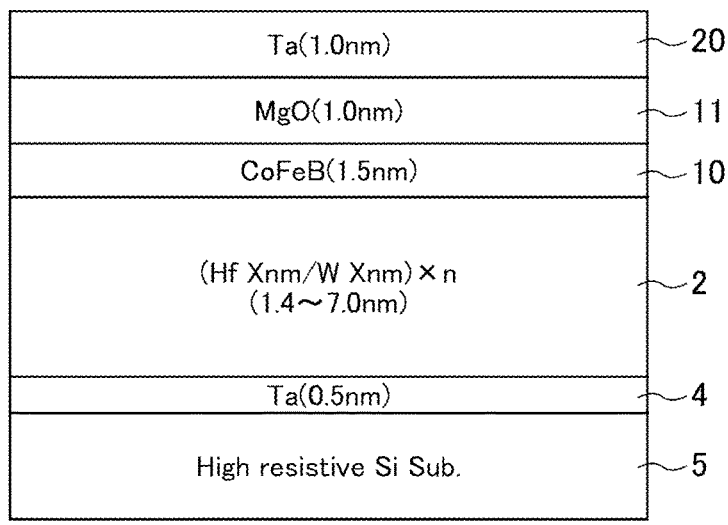
FIG. 10 is a schematic cross-sectional view of a sample according to Working Examples 1 and 2.
Figure 11:
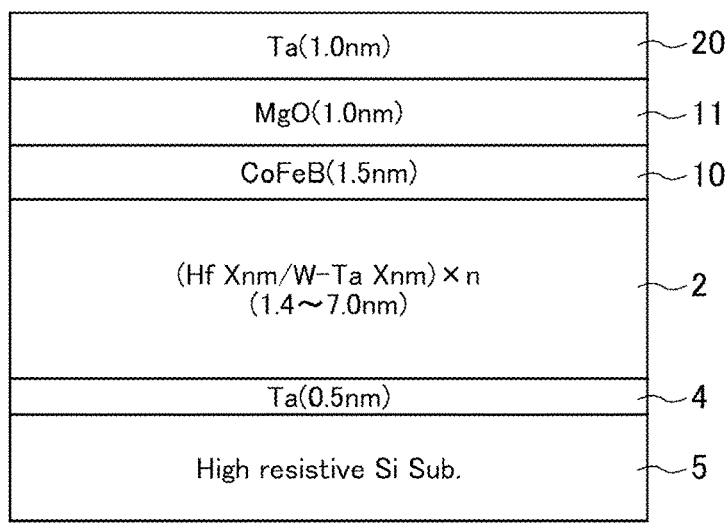
FIG. 11 is a schematic cross-sectional view of a sample according to Working Example 3.

FIG. 9 is a schematic cross-sectional view of a sample according to a comparison example. FIG. 10 is a schematic cross-sectional view of a sample according to Working Examples 1 and 2. FIG. 11 is a schematic cross-sectional view of a sample according to Working Example 3. For the magnetic multilayer film 1S constituting the samples according to Working Examples 1 to 3 or the comparison example, a high resistance Si substrate was used for the substrate 5 and Ta (thickness of 0.5 nm) was used for the buffer layer 4. In the sample of Working Example 1, an amorphous film (W/Hf) (thickness of 1.4 nm to 7.0 nm) in which a first layer (thickness of 0.35 nm) of Hf and a second layer (thickness of 0.35 nm) of W were alternately layered was formed as the heavy metal layer 2. In the sample of Working Example 2, an amorphous film (W/Hf) (thickness of 1.4 nm to 7.0 nm) in which a first layer (thickness of 0.7 nm) of Hf and a second layer (thickness of 0.7 nm) of W were alternately layered was formed as the heavy metal layer 2. In the sample of Working Example 3, an amorphous film (W—Ta/Hf) (thickness of 1.4 nm to 7.0 nm) in which a first layer (thickness of 0.7 nm) of Hf and a second layer (thickness of 0.7 nm) of W—Ta were alternately layered was formed as the heavy metal layer 2. In the sample of the comparison example, a β-phase W film (β-W) (thickness of 1.4 nm to 7.0 nm) was formed as the heavy metal layer 2a. In Working Examples 1 to 3 and the comparison example, CoFeB (1.5 nm) was formed as the recording layer 10, an MgO layer (1.0 nm) was formed as the barrier layer 11, and a Ta layer (1.0 nm) was formed as the conductive layer 20.

In the magnetic multilayer film 1S of Working Examples 1 to 3 and the comparison example, MgO is formed as the barrier layer on the CoFeB layer as the recording layer, and the magnetic multilayer film was formed to have a configuration close to a state in which the magnetic multilayer film is used as the magnetic memory element. Additionally, a conductive layer made of Ta corresponding to the cap layer is formed on the MgO layer, thereby mitigating changes in the state of the MgO layer resulting from oxygen and the like in the air. In the magnetic multilayer film 1S of Working Examples 1 to 3 and the comparison example, the respective layers were sequentially deposited by RF magnetron sputtering on the Si substrate, the surface of which has formed therein an $SiO_2$ layer that is a naturally oxidized film.

The heavy metal layer 2 of Working Examples 1 and 2 is an amorphous layer (W/Hf) formed by repeatedly and alternately forming a hafnium layer (deposited in an argon gas atmosphere of 0.3 Pa) as the Hf layer (first layer) and forming a tungsten layer (deposited in an argon gas atmosphere under two conditions: 2.55 Pa and 0.3 Pa) as the W layer (second layer), and upon layering the conductive layer made of the Ta layer, subjecting the deposited layers to heat treatment at 300° C. The heavy metal layer 2 of Embodiment 3 is an amorphous layer (W—Ta/Hf) formed by the above formation method for the heavy metal layer 2 except that a W—Ta layer is formed instead of the W layer (second layer). The heavy metal layer 2a of the comparison example is a β-phase W (β-W) formed by the above formation method for the heavy metal layer 2 except only a W layer (second layer) is formed in an argon gas atmosphere of 2.55 Pa without forming the Hf layer (first layer).

Although the W in the W/Hf was formed under two conditions with different gas pressures, both were confirmed to be amorphous by tomographic TEM, and the characteristics described below were found to be the same for both within a margin of error. The characteristics are believed to be the same because, by being sandwiched by amorphous Hf layers, heavy metals other than Hf including W and W—Ta also become amorphous and the same material is formed even with different gas pressures.

Verification Experiment 1

Figure 12:
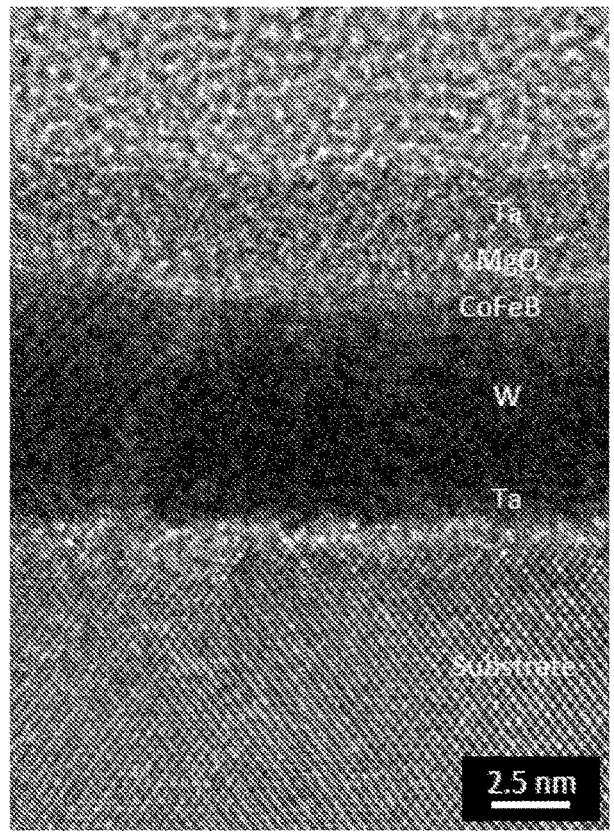
FIG. 12 is a TEM image of a cross section of the sample according to the comparison example.

In Verification Experiment 1, a TEM image was captured of the cross section of the samples of Working Examples 1 and 3 and the comparison example. FIG. 12 is a TEM image of a cross section of the sample according to the comparison example. A buffer layer (Ta), a heavy metal layer (W), a recording layer (CoFeB), a barrier layer (MgO), and a conductive layer (Ta) are layered on a substrate. The heavy metal layer (W) is a β-phase W (β-W). If the thickness of the heavy metal layer (W) exceeds 3 nm, roughness is worsened. The thickness of the heavy metal layer (W) shown in FIG. 12 is 7 nm. As a result of worsened roughness of the heavy metal layer (W), the roughness of the interface of layers above the heavy metal layer (W) is also worsened. It can be observed that the barrier layer (MgO) also exhibits low (100) crystal orientation.

Figure 13:
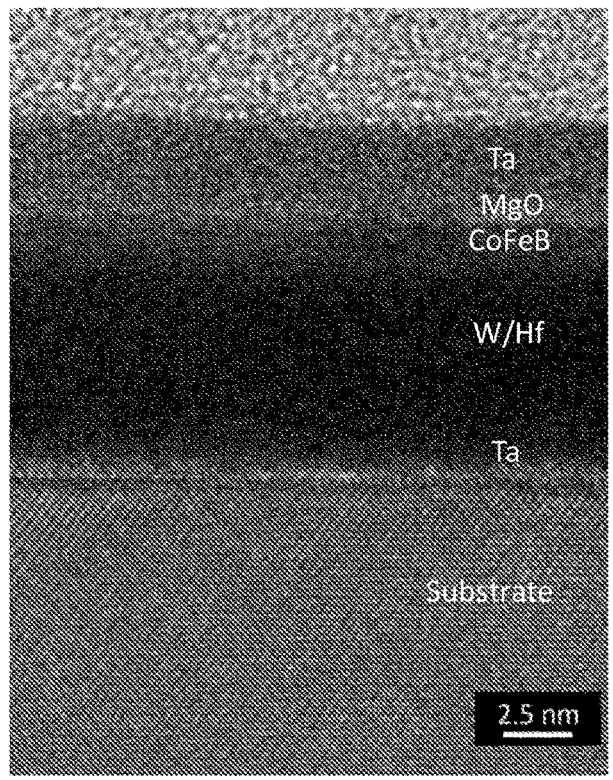
FIG. 13 is a TEM image of a cross section of the magnetic multilayer film according to Working Example 1.

FIG. 13 is a TEM image of a cross section of the sample according to Working Example 1. A buffer layer (Ta), a heavy metal layer (W/Hf), a recording layer (CoFeB), a barrier layer (MgO), and a conductive layer (Ta) are layered on a substrate. The heavy metal layer (W/Hf) is amorphous. The thickness of the heavy metal layer (W/Hf) is approximately 7 nm, and therefore, does exceed 3 nm, but the heavy metal layer (W/Hf) exhibits better surface roughness compared to FIG. 12, with greater flatness. As a result of better roughness of the heavy metal layer (W/Hf), the roughness of the interface of layers above the heavy metal layer (W/Hf) is also improved, with greater flatness. In this case, the recording layer (CoFeB) is amorphous. The barrier layer (MgO) was intended to be deposited to a thickness of 1.0 nm, but the actual thickness was 0.9 nm. It can be observed that the barrier layer is a crystalline film with clear MgO (100) crystal orientation.

Figure 14:
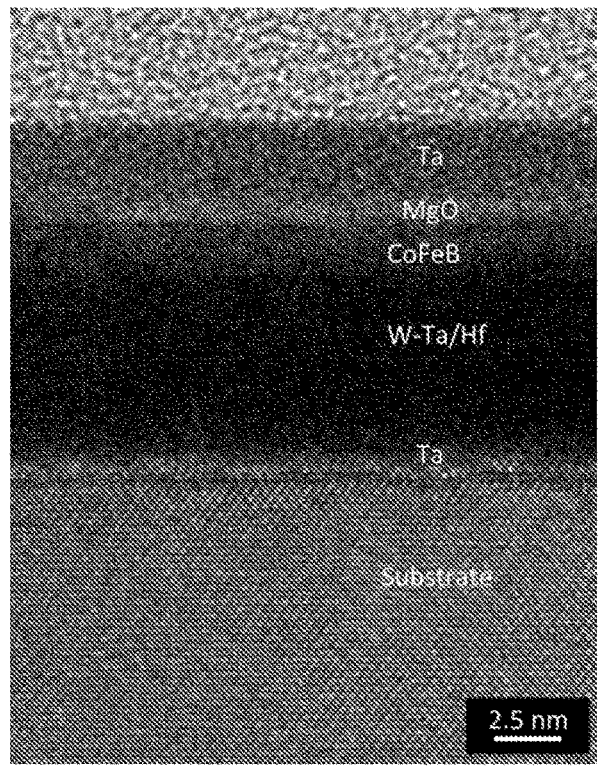
FIG. 14 is a TEM image of a cross section of the magnetic multilayer film according to Working Example 3.

FIG. 14 is a TEM image of a cross section of the sample according to Working Example 3. A buffer layer (Ta), a heavy metal layer (W—Ta/Hf), a recording layer (CoFeB), a barrier layer (MgO), and a conductive layer (Ta) are layered on a substrate. The heavy metal layer (W—Ta/Hf) is amorphous. The thickness of the heavy metal layer (W—Ta/Hf) is approximately 7 nm, and therefore, does exceed 3 nm, but the heavy metal layer (W—Ta/Hf) exhibits better surface roughness compared to FIG. 12, with greater flatness. As a result of better roughness of the heavy metal layer (W—Ta/Hf), the roughness of the interface of layers above the heavy metal layer (W—Ta/Hf) is also improved, with greater flatness. In this case, the recording layer (CoFeB) is amorphous. The barrier layer (MgO) was intended to be deposited to a thickness of 1.0 nm, but the actual thickness was 0.9 nm. It can be observed that the barrier layer is a crystalline film with clear MgO (100) crystal orientation.

Verification Experiment 2

In Verification Experiment 2, samples having different heavy metal layer thicknesses t (nm) were created for Working Examples 1, 2, and 3 and the comparison example, the conductances $G_{XX}$ ($\Omega^{-1}$) thereof were measured, and the dependence of the conductance on the heavy metal layer thickness t (nm) was determined. The electric resistivities ρxx (Ωcm) of the samples of Working Examples 1, 2, and 3 and the comparison example were determined according to the dependences of the attained conductances $G_{XX}$ ($\Omega^{-1}$) on the heavy metal layer thicknesses t (nm).

Figure 15:
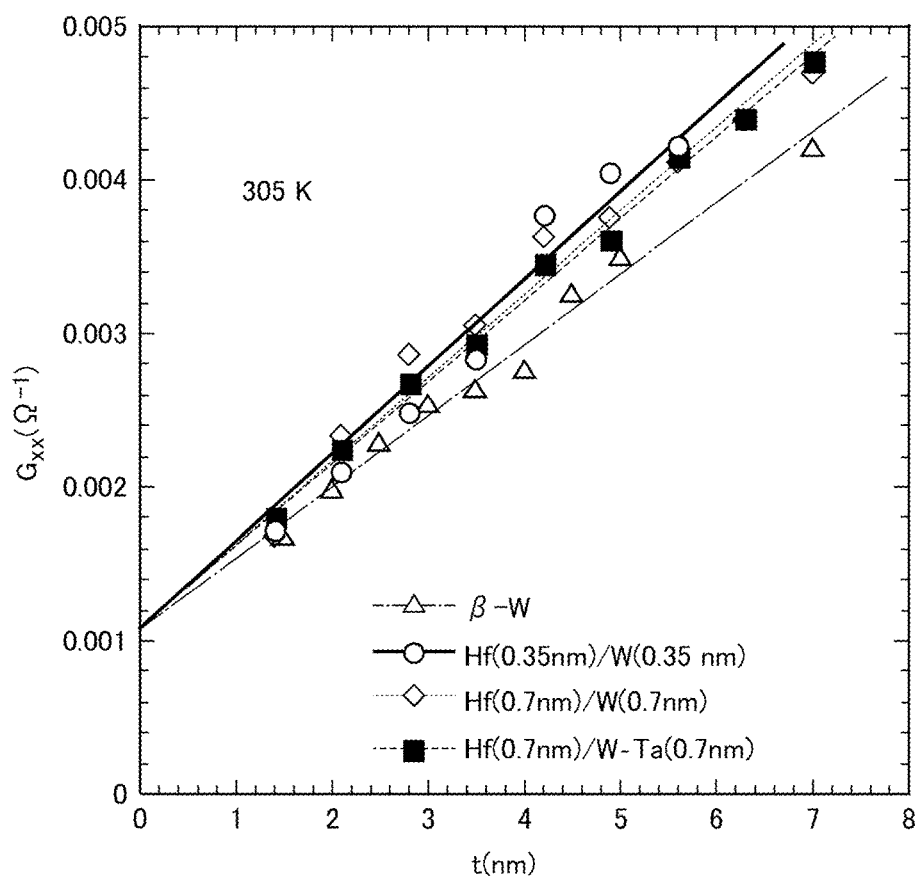
FIG. 15 is a graph showing the dependence of the conductance on the thickness of the heavy metal layer according to Verification Experiment 2.

FIG. 15 is a graph showing the dependence of the conductance on the heavy metal layer thickness according to Verification Experiment 2. In FIG. 15, the conductances are indicated for Working Example 1 (Hf (0.35 nm)/W (0.35 nm), with "○" symbol), Working Example 2 (Hf (0.7 nm)/W (0.7 nm), with "◇" symbol), Working Example 3 (Hf (0.7 nm)/W—Ta (0.7 nm), with "■" symbol), and the comparison example (β-W, with "Δ" symbol). The slopes of the curves for Working Examples 1 to 3 were confirmed to be greater than the slope of curve for the comparison example. The samples of the Working Examples 1, 2, and 3 and the comparison example, which differ in terms of the heavy metal layer thickness t (nm) have the same structure for sections other than the heavy metal layer, and thus, the difference between the curves of Working Examples 1 to 3 and the curve of the comparison example is caused by the heavy metal layer.

Figure 16:
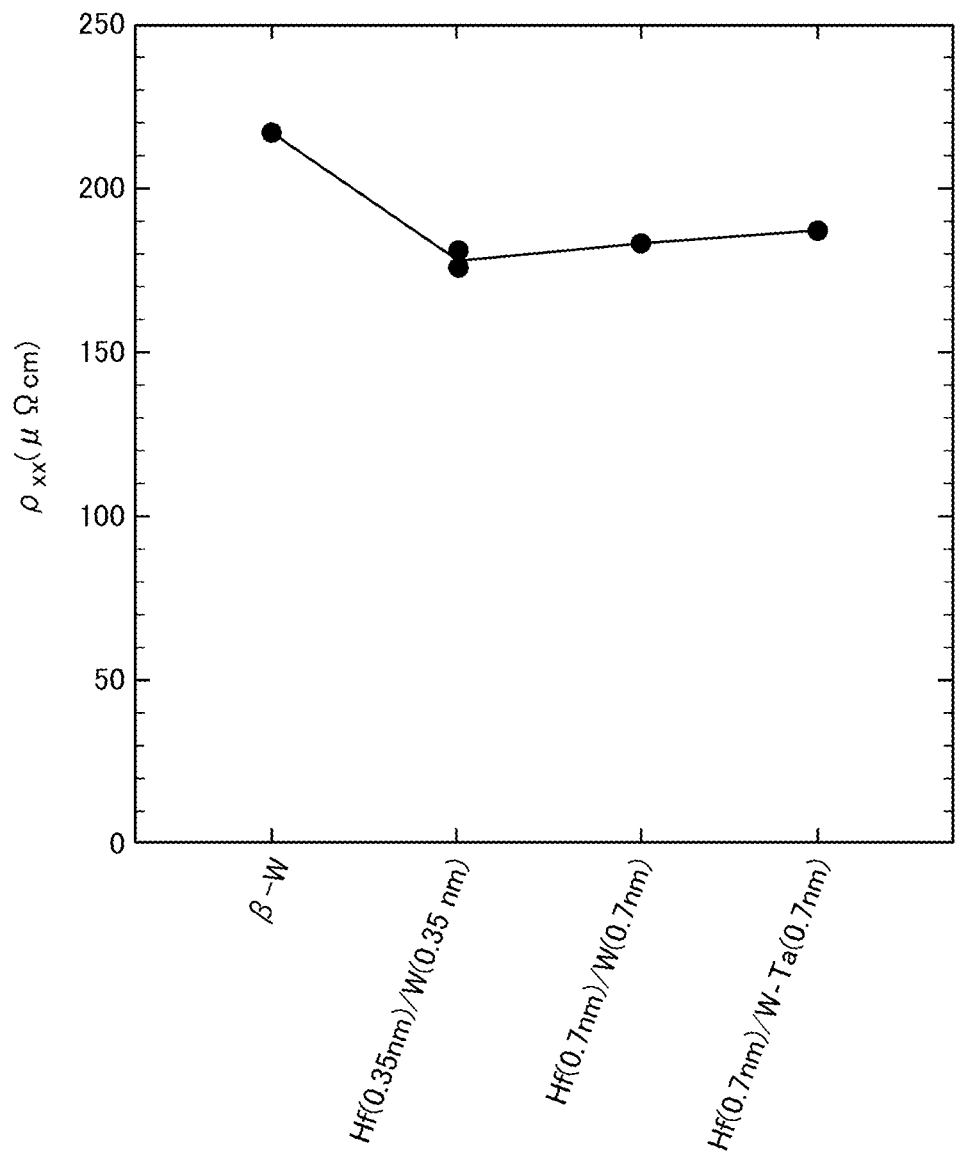
FIG. 16 is a graph showing the electrical resistivity according to Verification Experiment 2.

The electrical resistivity $\rho_{XX}$ (μΩcm) of the heavy metal layer of each sample of the Working Examples 1, 2, and 3 and the comparison example is attained by determining the inverse of the slope of each curve indicating the dependence of the conductance on the heavy metal layer thickness in Verification Experiment 2 of FIG. 15. FIG. 16 is a graph showing the electrical resistivity according to Verification Experiment 2. The electrical resistivity of the heavy metal layer (β-W) of the comparison example was 217.2 μΩcm.

The electrical resistivity of the heavy metal layer (Hf (0.35 nm)/W (0.35 nm)) of Working Example 1 was 176.3 to 181.2 μΩcm. The electrical resistivity of the heavy metal layer (Hf (0.7 nm)/W (0.7 nm)) of Working Example 2 was 184.0 μΩcm. The electrical resistivity of the heavy metal layer (Hf (0.7 nm)/W—Ta (0.7 nm)) of Working Example 3 was 187.7 μΩcm. It was confirmed that the samples of Working Examples 1 to 3 all had lower electrical resistivities than the sample of the comparison example.

Verification Experiment 3

Figure 17:
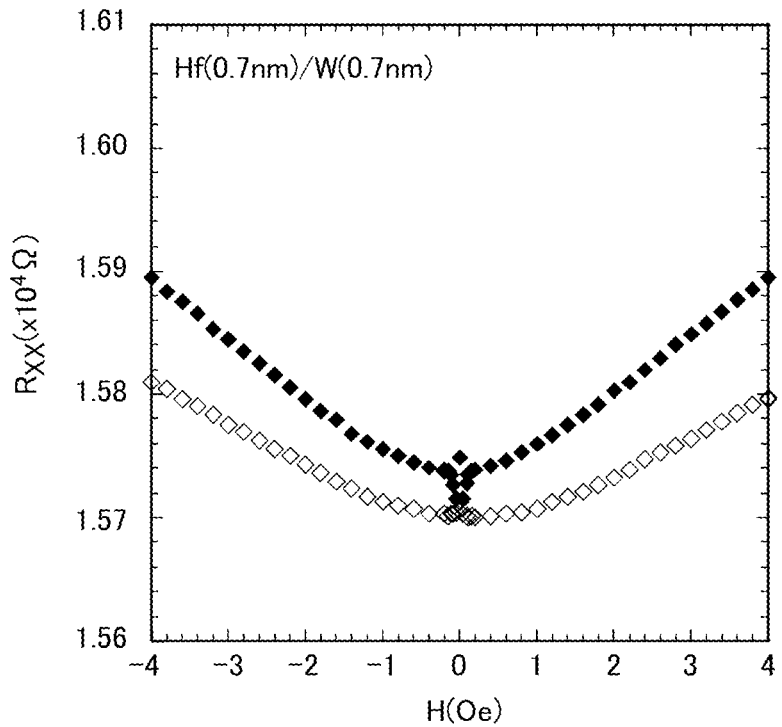
FIG. 17 is a graph showing the dependence of the electrical resistance on the magnetic field according to Verification Experiment 3 performed on the sample of Working Example 2.
Figure 18:
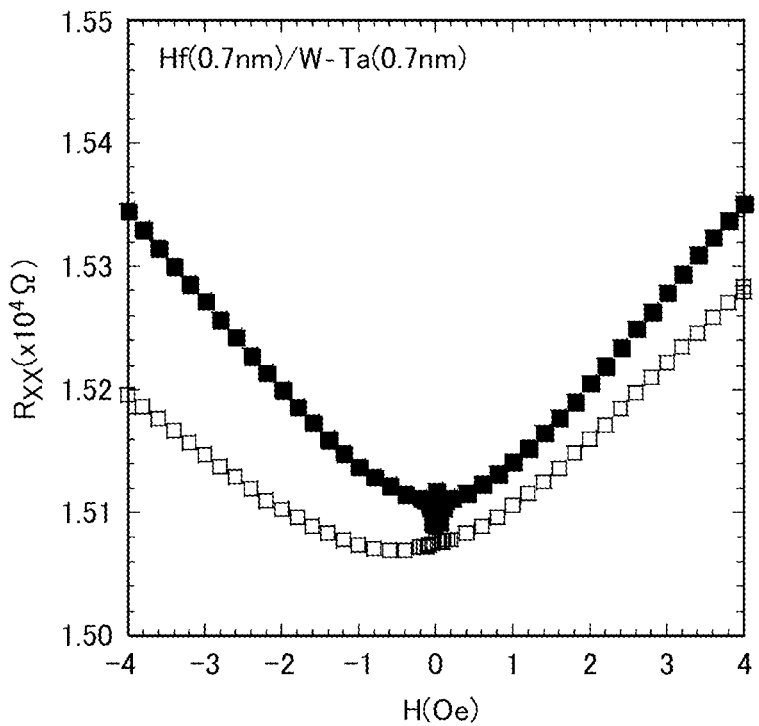
FIG. 18 is a graph showing the dependence of the electrical resistance on the magnetic field according to Verification Experiment 3 performed on the sample of Working Example 3.

In Verification Experiment 3, the dependence of the electrical resistance $R_{XX}$ (Ω) on the external magnetic field H (Oe) was determined for the samples of Working Examples 1, 2, and 3, and the comparison example. FIG. 17 is a graph showing the dependence of the resistance of the sample of Working Example 2 (Hf (0.7 nm)/W (0.7 nm)) on the external magnetic field. The external magnetic field H is generated by applying a y-direction magnetic field Hy or a z-direction magnetic field Hz. The electrical resistance $R_{XX}$ increases as the external magnetic field H increases from 0 in the y direction or the z direction. Here, the dependence of the resistance on the external magnetic field exhibits anisotropy in relation to the direction of the external magnetic field. That is, the dependence of the resistance on the external magnetic field differs depending on whether the external magnetic field is in the y direction or the z direction. In FIG. 17, the symbol "♦" indicates the dependence on the external magnetic field when the external magnetic field is in the z direction. Additionally, In FIG. 17, the symbol "◇" indicates the dependence on the external magnetic field when the external magnetic field is in the y direction. FIG. 18 shows the dependence of the resistance of the sample of Working Example 3 (Hf (0.7 nm)/W—Ta (0.7 nm)) on the external magnetic field, where the symbol "♦" indicates the dependence on the external magnetic field when the external magnetic field is in the z direction, and the symbol "◇" indicates the dependence when the external magnetic field is in the y direction.

Figure 19:
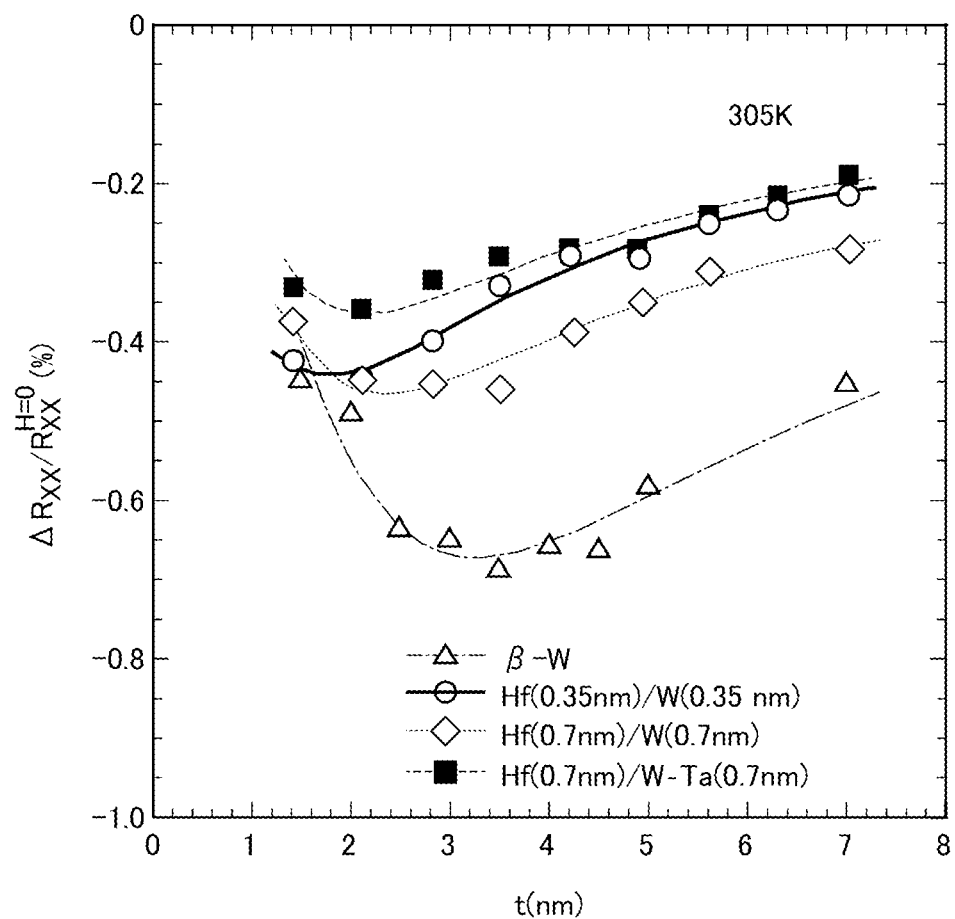
FIG. 19 is a graph showing the dependence of the spin Hall magnetoresistance ratio on the thickness according to Verification Experiment 3.

According to the dependence of the electrical resistance $R_{XX}$ (Ω) on the external magnetic field (Oe) for the samples of Working Examples 1, 2, and 3, and the comparison example, the spin Hall magnetoresistance ratio ($\Delta R_{XX}/R_{XX}^{H=0}$) (%) is determined. The spin Hall magnetoresistance ratio ($\Delta R_{XX}/R_{XX}^{H=0}$) is the ratio (%) of the difference $\Delta R_{XX}$ for when external magnetic fields are applied in the differing y and z directions in relation to the electrical resistance $R_{XX}^{H=0}$ for when the external magnetic field is 0. FIG. 19 is a graph showing the dependence of the spin Hall magnetoresistance ratio ($\Delta R_{XX}/R_{XX}^{H=0}$)(%) on the heavy metal layer thickness. In FIG. 19, the spin Hall magnetoresistance ratios are indicated for Working Example 1 (Hf (0.35 nm)/W (0.35 nm), with "○" symbol), Working Example 2 (Hf (0.7 nm)/W (0.7 nm), with "◇" symbol), Working Example 3 (Hf (0.7 nm)/W—Ta (0.7 nm), with "■" symbol), and the comparison example (β-W, with "▲" symbol). In Working Examples 1 to 3, the peak positions are where the thicknesses are thin, indicating that the spin diffusion length is short.

Verification Experiment 4

Figure 20:
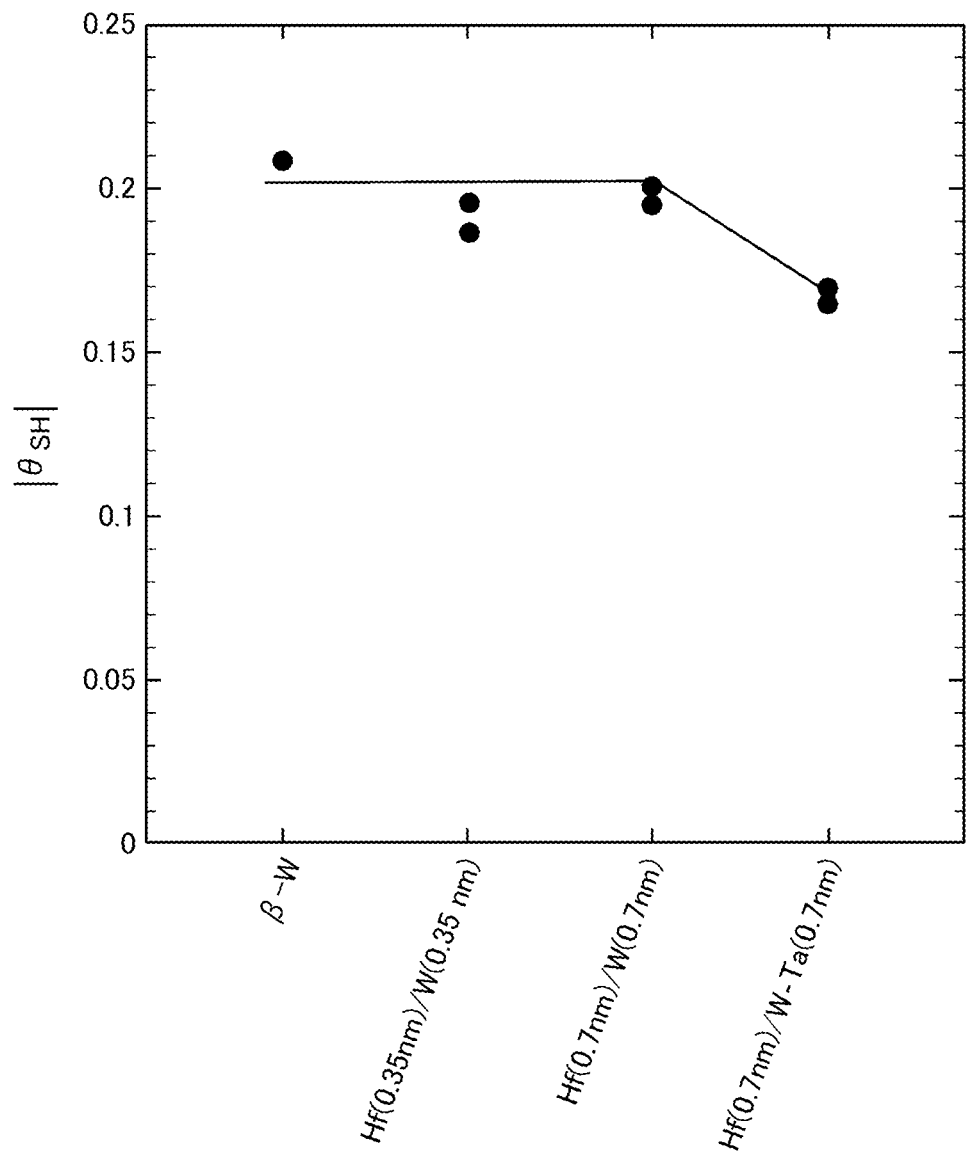
FIG. 20 is a graph showing the spin-Hall angle according to Verification Experiment 4.

In Verification Experiment 4, the spin-Hall angle $\theta_{SH}$ of the samples of Working Examples 1, 2, and 3 and the comparison example was determined by fitting the data of FIG. 19 to a diffusion model formula. The solid line and the various dotted lines of FIG. 19 are the result of fitting, and indicate that the data was well-reproduced. FIG. 20 is a graph showing the spin-Hall angle. The vertical axis of FIG. 20 is the absolute value $|\theta_{SH}|$ of the spin-Hall angle. The spin-Hall angle of the sample of the comparison example (β-W) is approximately 0.2, while the spin generation efficiencies of the samples of Working Examples 1 to 3 were similarly high values to that of the comparison example.

Verification Experiment 5

Figure 21:
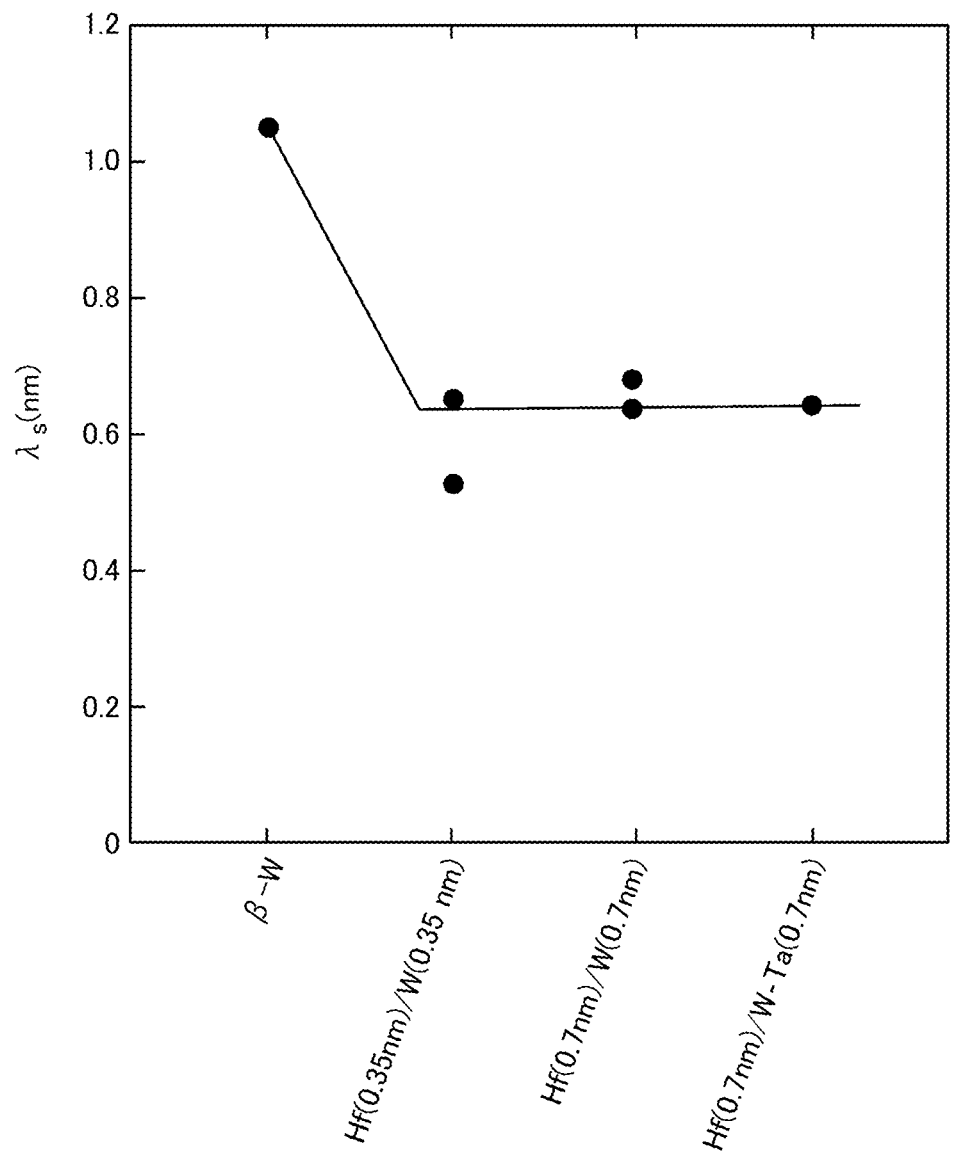
FIG. 21 is a graph showing the spin diffusion length according to Verification Experiment 5.

In Verification Experiment 5, the spin diffusion length $\lambda_S$ (nm) was determined for the samples of Working Examples 1, 2, and 3, and the comparison example. FIG. 21 is a graph showing the spin diffusion length according to Verification Experiment 5. The spin diffusion length was approximately 1 nm for the heavy metal layer (β-W) of the sample of the comparison example but was approximately 0.6 nm for the samples of Working Examples 1 to 3.

Verification Experiment 6

Figure 22:
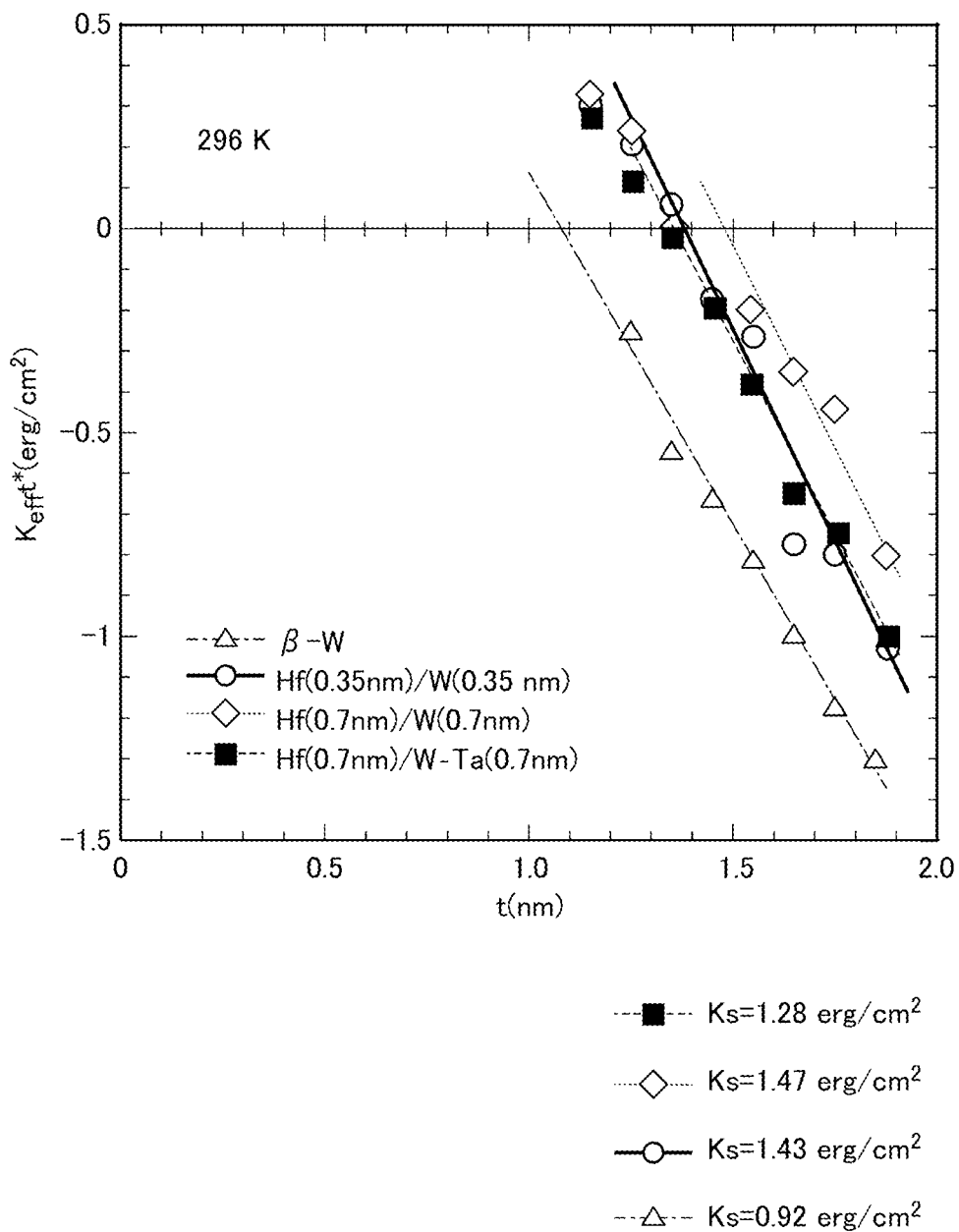
FIG. 22 is a graph showing the dependence on the thickness of the product of the magnetic anisotropy constant and the effective thickness of a recording layer (ferromagnetic layer) according to Verification Experiment 6.

In Verification Experiment 6, the product of an effective thickness t* and the magnetic anisotropy constant $K_{eff}$ of the samples of Working Examples 1, 2, and 3 and the comparison example was evaluated by a vibrating-sample magnetometer (VSM). Results of the product of the magnetic anisotropy constant $K_{eff}$ and the effective thickness t* evaluated by the VSM are shown in FIG. 22. In FIG. 22, the horizontal axis is the thickness t (nm) of the recording layer (ferromagnetic layer). In FIG. 22, the curves are shown for Working Example 1 (Hf (0.35 nm)/W (0.35 nm), with "○" symbol), Working Example 2 (Hf (0.7 nm)/W (0.7 nm), with "◇" symbol), Working Example 3 (Hf (0.7 nm)/W—Ta (0.7 nm), with "■" symbol), and the comparison example (β-W, with "Δ" symbol).

In FIG. 22, regions where the product of the magnetic anisotropy constant $K_{eff}$ and the effective thickness t* of the recording layer (ferromagnetic layer) is positive indicate a ferromagnetic layer where the magnetization direction is the perpendicular direction. Regions where the product of the magnetic anisotropy constant $K_{eff}$ and the effective thickness t* of the recording layer (ferromagnetic layer) is negative indicate a ferromagnetic layer where the magnetization direction is the in-plane direction. According to FIG. 22, it was confirmed that in the comparison example, unless the thickness of the recording layer (ferromagnetic layer) were reduced to 1 nm or less, the recording layer does not allow for magnetization in the perpendicular direction. The curves of Working Examples 1 to 3 are at positions shifted in the positive direction of the vertical axis in relation to the curve of the comparison example. This indicates, in other words, that a film can be realized in which magnetization is possible in the perpendicular direction even if the thickness of the recording layer (ferromagnetic layer) were as great as 1.4 nm.

The electrical resistivity (μΩcm), the spin Hall angle proportional to 1/Js, and a relative value for power consumption (where the value for the comparison example β-W is 1) from the above verification experiments are collectively indicated in table 1 for each heavy metal layer material. The heavy metal layer materials include those of Working Example 1 (Hf (0.35 nm)/W (0.35 nm)), Working Example 2 (Hf (0.7 nm)/W (0.7 nm)), Working Example 3 (Hf (0.7 nm)/W—Ta (0.7 nm)), and the comparison example (β-W).

TABLE 1

| Heavy Metal Layer Material | Resistivity (μΩcm) | Spin Hall Angle (α1/Js) | Relative Value for Power Consumption (Power Consumption During Writing/ Power Consumption During Writing for β-W Wiring) |
| --- | --- | --- | --- |
| β-W | 217.2 | 0.207 | 1 |
| (W (0.35 nm)/Hf (0.35 nm)) × n | 178.7 | 0.191 | 0.73 |
| (W (0.7 nm)/Hf (0.7 nm)) × n | 186.4 | 0.199 | 0.77 |
| (W—Ta (0.7 nm)/Hf (0.7 nm)) × n | 188 | 0.165 | 0.94 |

(2) Embodiment 2

(2-1) Overall Configuration of Magnetic Memory Element According to Embodiment 2

Figure 23A:
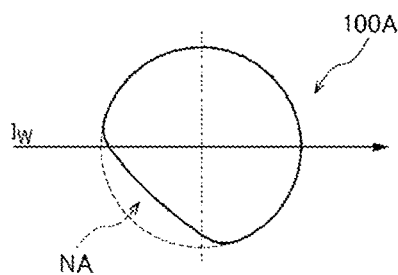
FIG. 23A is a plan view of an MTJ, having one example of a pillar shape, of a magnetic memory element according to Embodiment 2 of the present invention.
Figure 23B:
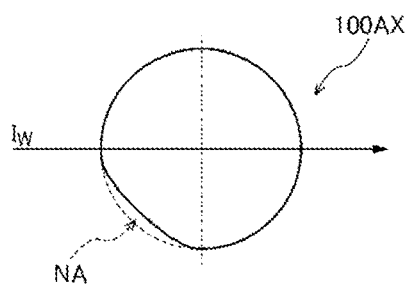
FIG. 23B is a plan view of an MTJ, having another example of a pillar shape, of a magnetic memory element according to Embodiment 2 of the present invention.

A magnetic memory element 100A according to Embodiment 2 of the present invention will be described with reference to FIG. 23A. FIG. 23A is a plan view of an MTJ in the form of a pillar according to one example of a magnetic memory element. The MTJ of the magnetic memory element 100A is substantially cylindrical, and a cutout section NA is provided in part from the external surface of the substantially cylindrical shape towards the inside. As shown in FIG. 23A, the cutout section NA is provided such that the plan view shape of the MTJ is asymmetrical to any line in a direction along the write current $I_W$. The surface of the MTJ at the cutout section NA has a shape protruding outward from the substantially cylindrical shape. FIG. 23B is a plan view of an MTJ in the form of a pillar according to another example of a magnetic memory element according to Embodiment 2 of the present invention. The cutout section NA may be large enough to be provided in a range from the third quadrant to the second quadrant and the fourth quadrant in the manner of the magnetic memory element 100A shown in FIG. 23A, or may be of a size to be provided only in the third quadrant in the manner of the magnetic memory element 100AX shown in FIG. 23B. In FIGS. 23A and 23B, examples were shown in which the cutout section is formed primarily in the third quadrant, but the cutout section may be formed in any of the first quadrant, the second quadrant, the third quadrant, or the fourth quadrant.

Figure 23C:
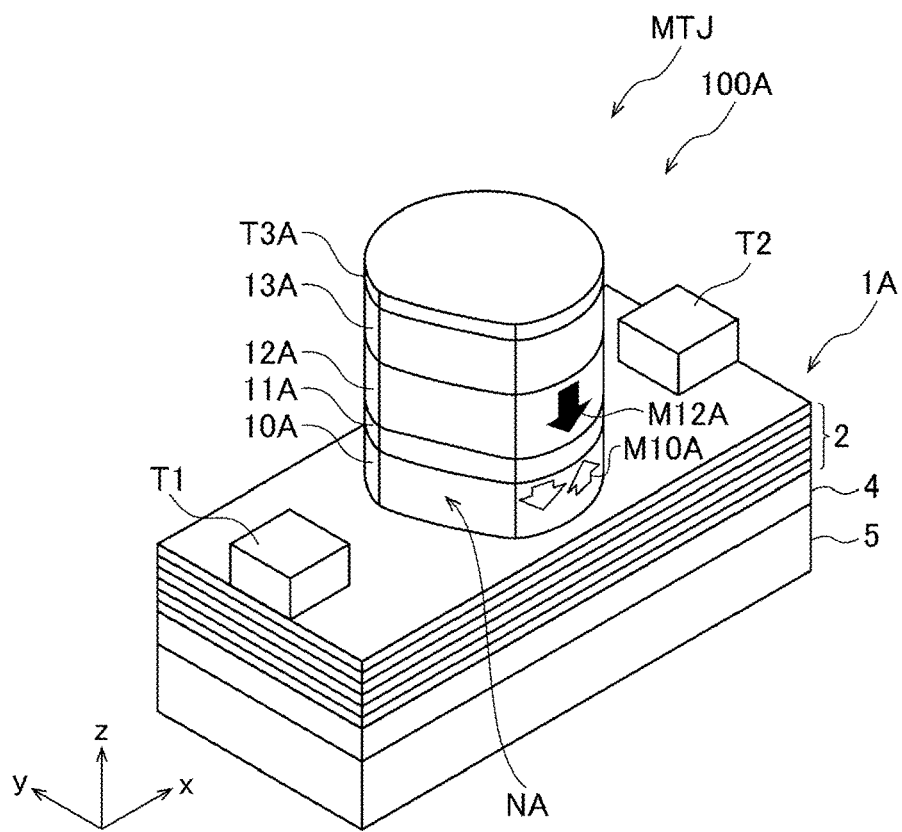
FIG. 23C is a perspective view of the magnetic memory element of FIG. 23A.

FIG. 23C is a perspective view of the magnetic memory element 100A shown in FIG. 23A. As shown in FIG. 23C, the magnetic multilayer film 1A includes the amorphous heavy metal layer 2 having a structure in which first layers containing Hf and second layers containing a heavy metal excluding Hf are alternately layered, and a recording layer 10A provided adjacent to the heavy metal layer 2. In the present embodiment, the heavy metal layer 2 has a rectangular cuboid shape extending along a first direction (x direction) and has a rectangular shape when viewed from above. The configuration of the heavy metal layer 2 is similar to that Embodiment 1. The magnetic memory element 100AX shown in FIG. 23B also has a similar configuration, and thus, the magnetic memory element 100A will be described below as a representative example.

In the present embodiment, the heavy metal layer 2 is provided on a substrate 5 made of Si, SiO$_2$, or the like, for example. One surface of the substrate 5 is provided with a buffer layer 4 made of Ta or the like, for example. The heavy metal layer 2 is provided adjacent to the buffer layer 4.

The recording layer 10A is formed adjacent to the surface of the heavy metal layer 2 opposite to the surface adjacent to the buffer layer 4. The recording layer 10A is made of a ferromagnetic layer, the magnetization direction of which can be reversed. A barrier layer 11A, a reference layer 12A, and a conductive layer 13A are layered in the stated order adjacent to the surface of the recording layer 10A opposite to the surface thereof adjacent to the heavy metal layer 2, and a third terminal T3A is provided in connection with the conductive layer 13A. Also, the heavy metal layer 2 is provided with a first terminal T1 and a second terminal T2 that are connected thereto. The laminate including the recording layer 10A, the barrier layer 11A, the reference layer 12A, the conductive layer 13A, and the third terminal T3A has a substantially cylindrical shape provided with the cutout section NA.

As described above, the shape of the laminate including the recording layer 10A, the barrier layer 11A, and the reference layer 12A as seen from the side opposite to the heavy metal layer 2 is asymmetrical to any line in a direction along the write current $I_W$. The materials and thicknesses of the recording layer 10A, the barrier layer 11A, the reference layer 12A, the conductive layer 13A, and the third terminal T3A are similar to those of Embodiment 1.

The writing method and the reading method for the magnetic memory element 100A can be similar to those of Embodiment 1. As described above, the shape of the laminate including the recording layer 10A, the barrier layer 11A, and the reference layer 12A as seen from the side opposite to the heavy metal layer 2 is asymmetrical to any line in a direction along the write current $I_W$, and thus, it is possible to reverse the magnetization direction during writing even without an external magnetic field.

(2-2) Overall Configuration of Magnetic Memory

Figure 24:
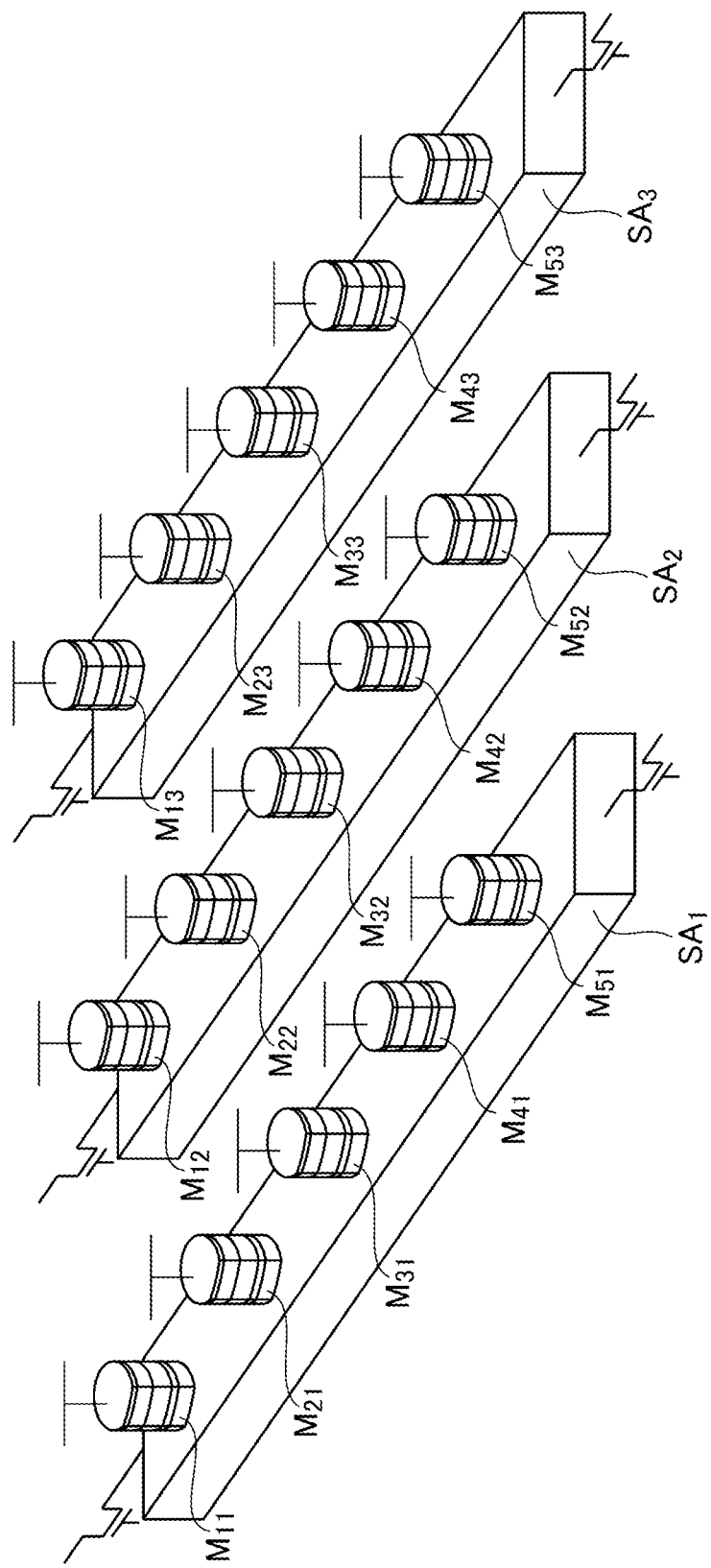
FIG. 24 is a schematic perspective view of one example of a magnetic memory using an array of the magnetic memory elements of FIG. 23A.

FIG. 24 is a schematic perspective view of one example of a magnetic memory using an array of the magnetic memory elements 100A of FIG. 23A. Five magnetic memory elements $M_{11}$ to $M_{51}$ are provided on a common substrate $SA_1$. The common substrate $SA_1$ is a laminate including the substrate 5, the buffer layer 4, and the heavy metal layer 2, and is a substrate common to the five magnetic memory elements $M_{11}$ to $M_{51}$. The five magnetic memory elements $M_{11}$ to $M_{51}$ are each constituted of a laminate including the recording layer 10A, the barrier layer 11A, the reference layer 12A, the conductive layer 13A, and the third terminal T3A, and has a substantially cylindrical shape provided with a cutout section. The common substrate $SA_1$ is provided such that the write voltage can be applied via a transistor to a first terminal (not shown) provided on the first end in the lengthwise direction and a second terminal (not shown) provided on the second end is connected to ground via a transistor. Similarly, five magnetic memory elements $M_{12}$ to $M_{52}$ are provided on a common substrate $SA_2$ and five magnetic memory elements $M_{13}$ to $M_{53}$ are provided on a common substrate $SA_3$. The common substrates $SA_1$ to $SA_3$ are provided parallel to each other. In this array, 5×3 magnetic memory elements are integrated. The drawing shows an array of 5×3 magnetic memory elements, but the configuration is not limited thereto, and the present invention can be applied to an array in which m×n magnetic memory elements are integrated.

The magnetic memory has a writing unit (not shown) provided with a writing power source that writes data to the magnetic memory elements $M_{11}$ to $M_{53}$. The writing unit passes a write current $I_W$ to the heavy metal layer 2 to write data to the magnetic memory elements $M_{11}$ to $M_{53}$.

The magnetic memory has a reading unit (not shown) provided with a read-out power source and a current detector, and writes data to the magnetic memory elements $M_{11}$ to $M_{53}$. The read-out power source passes a read-out current $I_r$ through the barrier layer 11. The current detector detects the read-out current $I_r$ passing through the barrier layer 11 and reads data written to the magnetic memory elements $M_{11}$ to $M_{53}$.

The writing method for the magnetic memory elements $M_{11}$ to $M_{53}$ will be described next. Here, a case will be described in which the second terminal T2 of the heavy metal layer 2 is directly connected to ground, but the second terminal T2 may be connected to ground via a transistor. As an initial state, the transistor connected to the first terminal T1 of the heavy metal layer 2 and the transistors connected to the third terminals T3A of the MTJs are all turned OFF. First, the transistors connected to the third terminals T3A of the MTJs are all turned ON to reduce the magnetic anisotropy of the recording layers 10A of the MTJs. Next, the write voltage $V_W$ is set to a positive voltage, the transistor connected to the first terminal T1 is turned ON, and the write current $I_W$ is passed from the first terminal T1 to the second terminal T2. As a result, 0 is written all at once to all MTJs. Then, the transistors connected to the third terminals T3A of the MTJs are all turned OFF and the transistor connected to the first terminal T1 is turned OFF.

Next, the transistor connected to the third terminal T3A of the MTJ to which "1" is to be written is turned ON to select the MTJ for writing. Then, the write voltage $V_W$ is set to a negative voltage, the transistor connected to the first terminal is turned ON, and the write current $I_W$ is passed from the second terminal T2 to the first terminal T1. Only the MTJ in which the transistor connected to the third terminal T3A was turned ON has a recording layer 10A with a low magnetic anisotropy, and thus, the magnetization is reversed. As a result, "1" is written to only the selected MTJ. Then, the transistors connected to all of the third terminals T3A are turned OFF and the transistor connected to the first terminal T1 is turned OFF, thereby completing the writing operation. A configuration may alternatively be adopted in which "1" is written simultaneously to all MTJs and then "0" is written only to selected MTJs. The reading operation is performed by turning ON the transistor connected to the first terminal T1, turning ON the transistor connected to the third terminal T3A of the MTJ from which data is to be read, and then passing the read-out current $I_r$ to the MTJ from which data is to be read. The reading operation thereafter is similar to Embodiment 1, and thus, description thereof is omitted.

As described above, the magnetic multilayer film 1A of Embodiment 2 is a multilayer film for a magnetic memory element and includes the amorphous heavy metal layer having a structure in which first layers containing Hf and second layers containing a heavy metal excluding Hf are alternately layered, and a recording layer that includes ferromagnetic layers, the magnetization directions of which can be reversed, and that is adjacent to the heavy metal layer.

Thus, in the magnetic multilayer film 1A, the heavy metal layer 2 is constituted of amorphous layers having a structure in which the first layers containing Hf and the second layers containing a heavy metal excluding Hf are alternately layered, and therefore, it is possible to set the electrical resistivity of the heavy metal layer to be lower than β-W and suppress power consumption. Also, it is possible to reduce the roughness of the heavy metal layer to less than (3-W and to mitigate variation in MTJ characteristics.

Modification Example 1

Figure 25A:
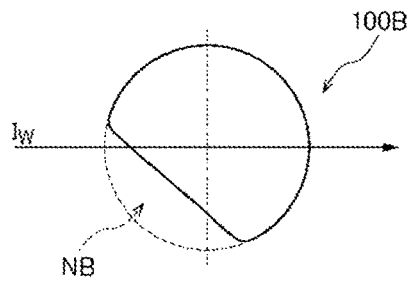
FIG. 25A is a plan view of an MTJ, having another example of a pillar shape, of a magnetic memory element according to Embodiment 2 of the present invention.
Figure 25B:
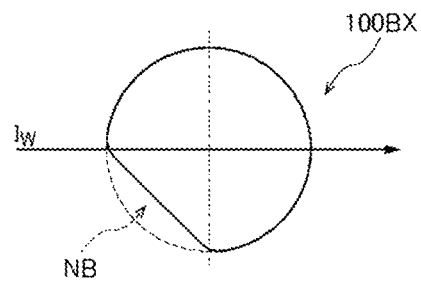
FIG. 25B is a plan view of an MTJ, having another example of a pillar shape, of a magnetic memory element according to Embodiment 2 of the present invention.

FIG. 25A is a plan view of an MTJ, having another example of a pillar shape, of a magnetic memory element according to Embodiment 2 of the present invention. Regarding pillar-shaped MTJs of other examples of the magnetic memory element shown in FIG. 23A to 23C, the surface of the MTJ at the cutout section NA had a shape protruding outward from the substantially cylindrical shape, but the shape is not limited thereto. The cutout section NB may have a flat surface in the manner of the magnetic memory element 100B shown in FIG. 25A. In this configuration as well, the cutout section NB is provided such that the plan view shape of the MTJ is asymmetrical to any line in a direction along the write current $I_W$. FIG. 25B is a plan view of an MTJ, having another example of a pillar shape, of a magnetic memory element according to Embodiment 2 of the present invention. The cutout section NB may be large enough to be provided in a range from the third quadrant to the second quadrant and the fourth quadrant in the manner of the magnetic memory element 100B shown in FIG. 25A, or may be of a size to be provided only in the third quadrant in the manner of the magnetic memory element 100BX shown in FIG. 25B.

Figure 26A:
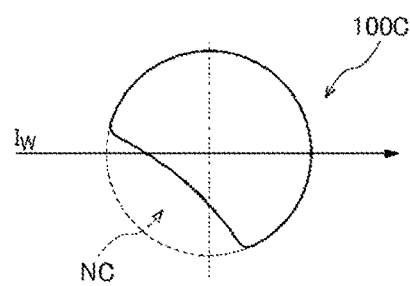
FIG. 26A is a plan view of an MTJ, having another example of a pillar shape, of a magnetic memory element according to Embodiment 2 of the present invention.
Figure 26B:
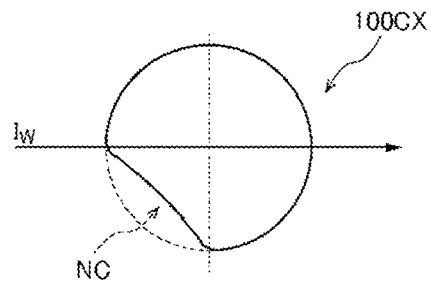
FIG. 26B is a plan view of an MTJ, having another example of a pillar shape, of a magnetic memory element according to Embodiment 2 of the present invention.

FIG. 26A is a plan view of an MTJ, having another example of a pillar shape, of a magnetic memory element according to Embodiment 2 of the present invention. The surface of the MTJ at the cutout section NC may have a recessed shape facing the outward direction of the substantially cylindrical shape in the manner of the magnetic memory element 100C shown in FIG. 26A. In this configuration as well, the cutout section NC is provided such that the plan view shape of the MTJ is asymmetrical to any line in a direction along the write current $I_W$. The cutout section NC may be large enough to be provided in a range from the third quadrant to the second quadrant and the fourth quadrant in the manner of the magnetic memory element 100C shown in FIG. 26A, or may be of a size to be provided only in the third quadrant in the manner of the magnetic memory element 100CX shown in FIG. 26B.

(3) Embodiment 3

(3-1) Overall Configuration of Magnetic Memory Element According to Embodiment 3

Figure 27A:
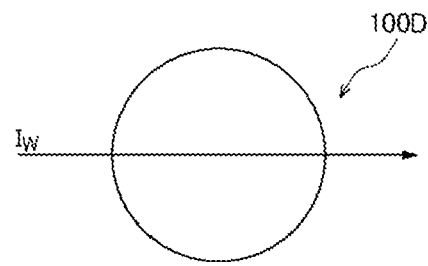
FIG. 27A is a plan view of an MTJ, having one example of a pillar shape, of a magnetic memory element according to Embodiment 3 of the present invention.

Below, a magnetic memory element 100D according to Embodiment 3 of the present invention will be described with reference to FIGS. 27A and 27B. FIG. 27A is a plan view of an MTJ in the form of a pillar according to one example of a magnetic memory element. The MTJ of the magnetic memory element 100D is substantially cylindrical. The MTJ is not provided with a cutout section like those of the MTJs shown in FIGS. 23A and 23B. As shown in FIG. 27A, the plan view shape of the MTJ has linear symmetry to a line in a direction along the write current $I_W$. In FIG. 27A, the plan view shape of the MTJ is a circle, and the MTJ has linear symmetry to a line passing through the center of the circle.

Figure 27B:
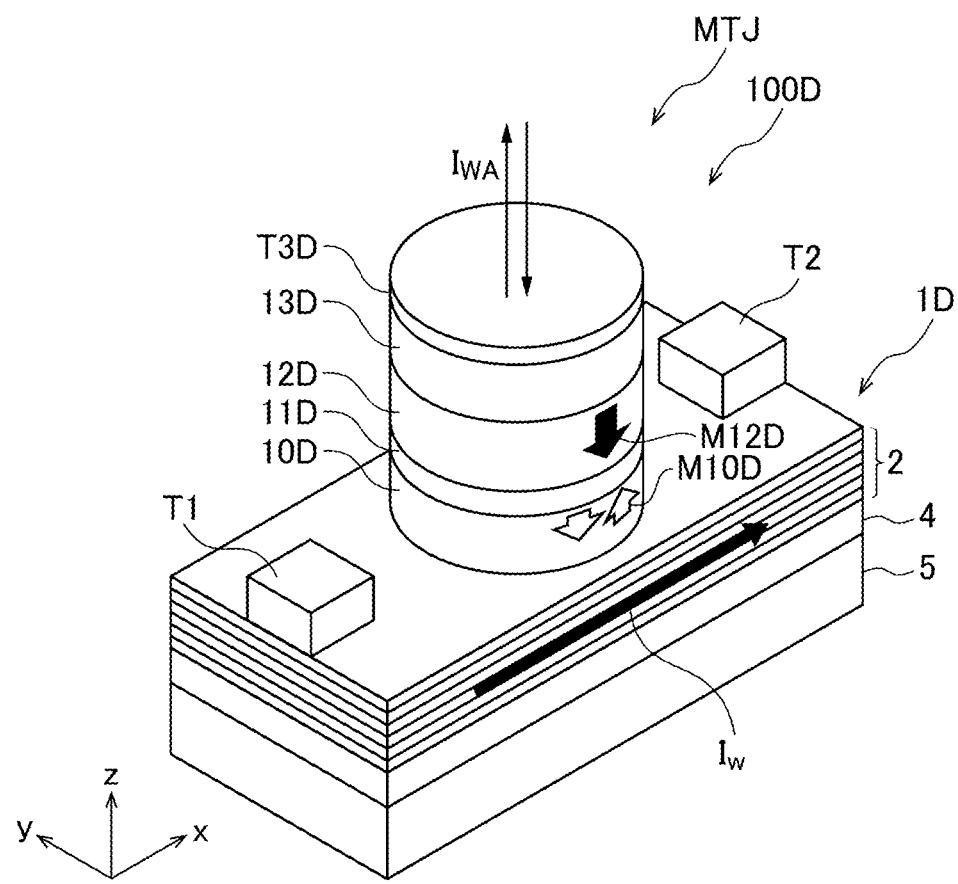
FIG. 27B is a perspective view showing a method for writing data to the magnetic memory element of FIG. 27A.

FIG. 27B is a perspective view of the magnetic memory element 100D in FIG. 27A. As shown in FIG. 27B, the magnetic multilayer film 1D includes the amorphous heavy metal layer 2 having a structure in which first layers containing Hf and second layers containing a heavy metal excluding Hf are alternately layered, and a recording layer 10D provided adjacent to the heavy metal layer 2. In the present embodiment, the heavy metal layer 2 has a rectangular cuboid shape extending along a first direction (x direction) and has a rectangular shape when viewed from above. The configuration of the heavy metal layer 2 is similar to that Embodiment 1.

In the present embodiment, the heavy metal layer 2 is provided on a substrate 5 made of Si, $SiO_2$, or the like, for example. One surface of the substrate 5 is provided with a buffer layer 4 made of Ta or the like, for example. The heavy metal layer 2 is provided adjacent to the buffer layer 4.

The recording layer 10D is formed adjacent to the surface of the heavy metal layer 2 opposite to the surface adjacent to the buffer layer 4. The recording layer 10D is made of a ferromagnetic layer, the magnetization direction of which can be reversed. A barrier layer 11D, a reference layer 12D, and a conductive layer 13D are layered in the stated order adjacent to the surface of the recording layer 10D opposite to the surface adjacent to the heavy metal layer 2, and a third terminal T3D is provided in connection with the conductive layer 13D. Also, the heavy metal layer 2 is provided with a first terminal T1 and a second terminal T2 that are connected thereto. The laminate including the recording layer 10D, the barrier layer 11D, the reference layer 12D, the conductive layer 13D, and the third terminal T3D has a substantially cylindrical shape.

As described above, the shape of the laminate including the recording layer 10D, the barrier layer 11D, and the reference layer 12D as seen from the side opposite to the heavy metal layer 2 has linear symmetry to a line in a direction along the write current $I_W$. The materials and thicknesses of the recording layer 10D, the barrier layer 11D, the reference layer 12D, the conductive layer 13D, and the third terminal T3D are similar to those of Embodiment 1.

The writing method for the magnetic memory element 100D will be described next. Here, the writing method for the magnetic memory element 100D when applied to an artificial intelligence system mentioned later will be described. As an initial state, the transistor connected to the first terminal T1 of the heavy metal layer 2 and the transistors connected to the third terminals T3D of the MTJs are all turned OFF. The write voltage $V_W$ is set to a positive voltage, the transistor connected to the first terminal T1 is turned ON, and the write current $I_W$ is passed from the first terminal T1 to the second terminal T2. As a result, the magnetic anisotropy constant of the MTJ is low, and thus, the recording layer 10 having perpendicular magnetization rotates and the axis of easy magnetization thereof does not settle into a stable direction. Next, the transistors connected to the third terminals T3D of the MTJs are all turned ON, and a write supplement current $I_{WA}$ is passed, with writing only performed in locations where the current was passed. Then, the transistors connected to the third terminals T3D of the MTJs are all turned OFF and the transistor connected to the first terminal T1 is turned OFF.

Next, the write voltage $V_W$ is set to a negative voltage, the transistor connected to the first terminal T1 is turned ON, and the write current $I_W$ is passed from the second terminal T2 to the first terminal T1. When the magnetic anisotropy constant Δ of the recording layer 10D is set to a low value of 5 to 15, then when the write current $I_W$ is passed therein, the recording layer 10D having perpendicular magnetization rotates and the axis of easy magnetization thereof does not settle into a stable direction. Then, when the transistor connected to the third terminal T3D of the MTJ to which "1" is to be written is turned ON to select the MTJ and the write supplement current $I_{WA}$ is passed therethrough, the recording layer 10D having the perpendicular magnetization is set to the direction in which the write supplement current $I_{WA}$ flows, causing the axis of easy magnetization to invert to a stable state due to spin transfer torque. If using this element as a cross-point memory of a crossbar network, when the magnetic anisotropy constant Δ of the recording layer 10D is set to a low value of 5 to 15, then when the write current $I_W$ is passed therein, the recording layer 10D having perpendicular magnetization rotates and the axis of easy magnetization thereof does not settle into a stable direction, but this is written to circular magnetic field application wiring to be mentioned later. In this case, the magnetic anisotropy constant Δ of the recording layer 10D has a small value of 5 to 15, and thus, it is possible to perform writing with a small current magnetic field.

Figure 28:
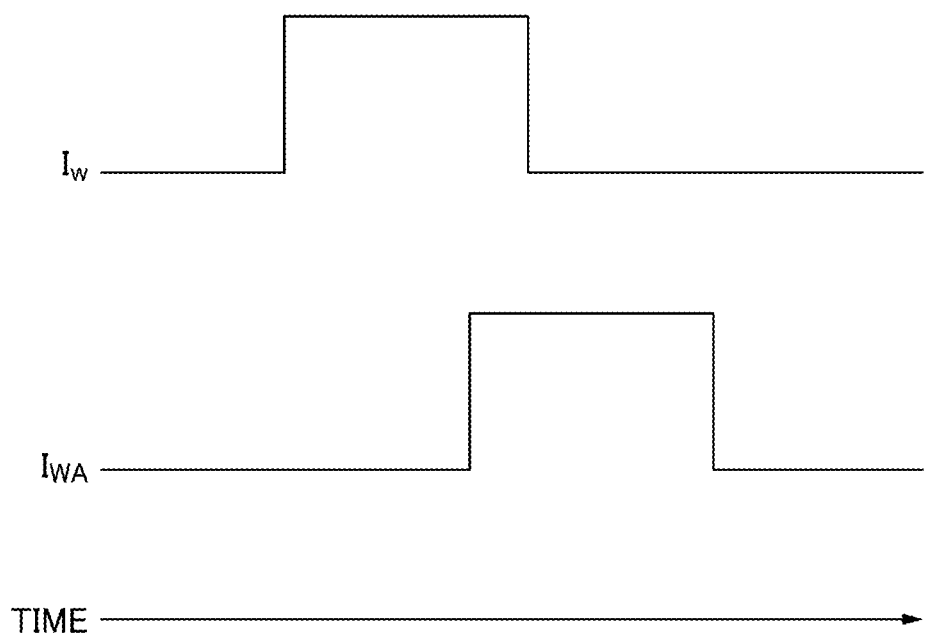
FIG. 28 is timing chart for signals for writing data to the magnetic memory element of FIG. 27A.

FIG. 28 is timing chart for signals for writing data to the magnetic memory element 100D. The write current $I_W$ and the write supplement current $I_{WA}$ are pulse currents. As shown in FIG. 28, the pulse of the write current $I_W$ and the pulse of the write supplement current $I_{WA}$ are at timings such that there is temporal overlap in at least a portion of the pulses. As shown in FIG. 28, for example, the pulse of the write current $I_W$ turns ON first, and the pulse of the write supplement current $I_{WA}$ turns ON prior to the pulse of the write current $I_W$ turning OFF. Then, the pulse of the write current $I_W$ turns OFF, and the pulse of the write supplement current $I_{WA}$ turns OFF.

A configuration may alternatively be adopted in which "1" is written simultaneously to all MTJs and then "0" is written only to selected MTJs. The reading operation is performed by turning ON the transistor connected to the first terminal T1, turning ON the transistor connected to the third terminal T3D of the MTJ from which data is to be read, and then passing the read-out current $I_r$ to the MTJ from which data is to be read.

The reading method for the magnetic memory element 100D is the same as Embodiment 1, and thus, description thereof is omitted.

As described above, the magnetic multilayer film 1D of Embodiment 3 is a multilayer film for a magnetic memory element and includes the amorphous heavy metal layer having a structure in which first layers containing Hf and second layers containing a heavy metal excluding Hf are alternately layered, and a recording layer that includes ferromagnetic layers, the magnetization directions of which can be reversed, and that is adjacent to the heavy metal layer.

Thus, in the magnetic multilayer film 1D, the heavy metal layer 2 is constituted of amorphous layers having a structure in which the first layers containing Hf and the second layers containing a heavy metal excluding Hf are alternately layered, and therefore, it is possible to set the electrical resistivity of the heavy metal layer to be lower than β-W and suppress power consumption. Also, it is possible to reduce the roughness of the heavy metal layer to less than β-W and to mitigate variation in MTJ characteristics.

(3-2) Overall Configuration of Artificial Intelligence (AI) System

Figure 29:
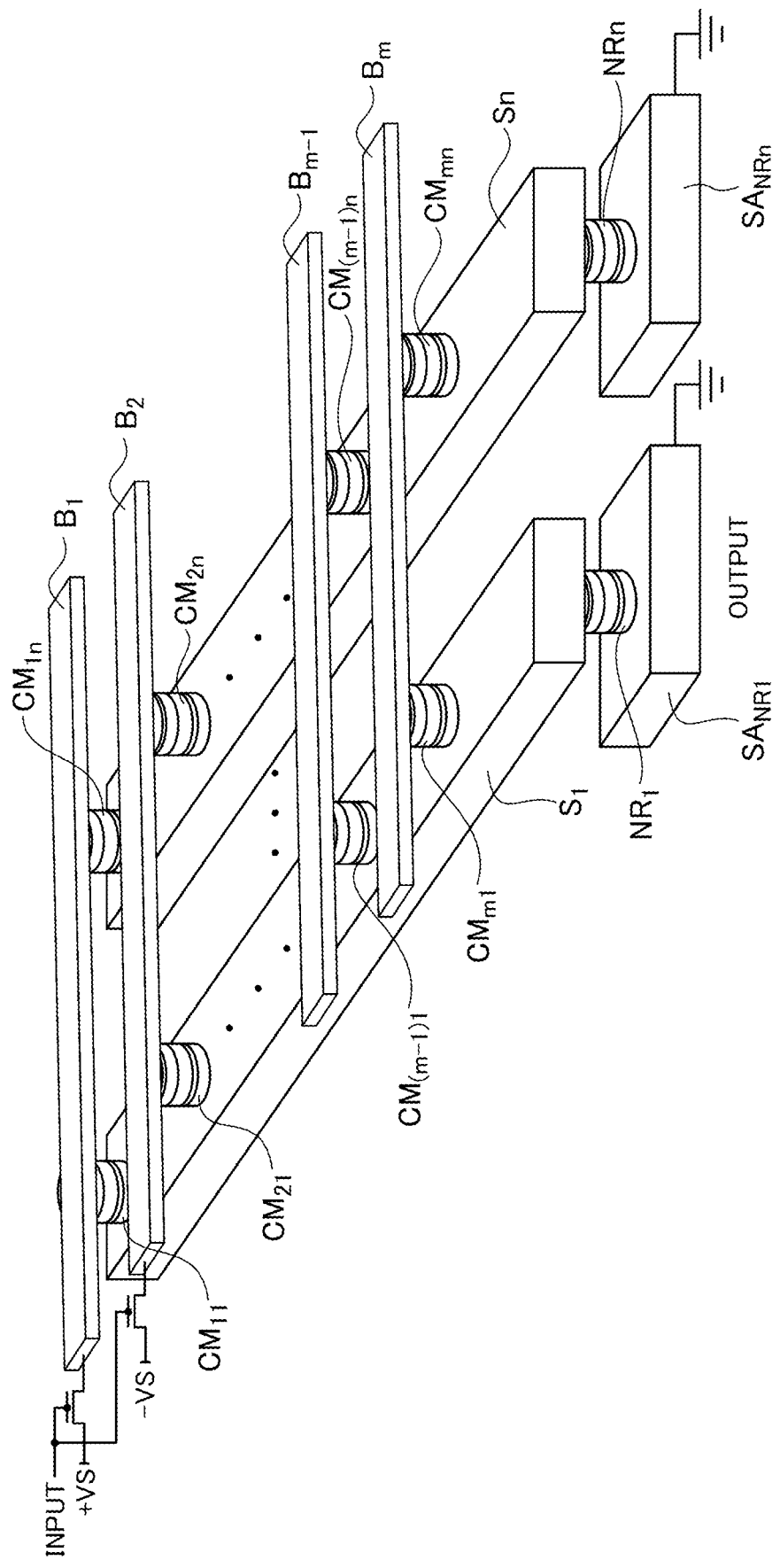
FIG. 29 is a schematic perspective view showing an example of an AI system using the magnetic memory elements according to Embodiment 3 of the present invention.

FIG. 29 is a schematic perspective view showing an example of an AI system using the magnetic memory elements according to Embodiment 3 of the present invention. A plurality of first wiring lines ($S_1$ to $S_n$) extending in one direction and a plurality of second wiring lines ($B_1$ to $B_m$) extending in a direction perpendicular to the one direction are provided, and at each intersection point between the first wiring lines ($S_1$ to $S_n$) and the second wiring lines ($B_1$ to $B_m$), a crosspoint memory ($CM_{11}$ to $CM_{mn}$) connected to each of the first wiring lines ($S_1$ to $S_n$) and second wiring lines ($B_1$ to $B_m$) is provided. The crosspoint memories ($CM_{11}$ to $CM_{mn}$) are constituted of a storage element such as a ReRAM (resistance change memory), a PCM (phase-change memory), or an MTJ. Thus, a resistive crossbar network is provided.

An input line INPUT is connected to the first end of each of the first wiring lines ($S_i$ to $S_n$), and an electronic neuron ($NR_1$ to $NR_n$) is connected to the second end of each of the first wiring lines. The electronic neurons ($NR_1$ to $NR_n$) are formed on neuron substrates ($SA_{NR1}$ to $SA_{NRn}$). The neuron substrates ($SA_{NR1}$ to $SA_{NRn}$) are laminates, each of which includes the substrate 5, the buffer layer 4, and the heavy metal layer 2. The electronic neurons ($NR_1$ to $NR_n$) are similar in configuration to the magnetic memory element 100D. The neuron substrates ($SA_{NR1}$ to $SA_{NRn}$) are connected to an output line OUTPUT.

The magnetic memory element 100D described above is used as each of the electronic neurons ($NR_1$ to $NR_n$) to which the weighted sum of the resistive crossbar network is inputted. In other words, the heavy metal layer 2 provided in each of the neuron substrates ($SA_{NR1}$ to $SA_{NRn}$) is constituted of amorphous layers having a structure in which the first layers containing Hf and the second layers containing a heavy metal excluding Hf are alternately layered. The above resistive crossbar network is one stage, and the configuration is such that a plurality of stages thereof are connected, with the output from a prior stage of the resistive crossbar network being inputted to the subsequent stage of the resistive crossbar network. In this manner, the AI system of the present embodiment is configured. The cross-point memories ($CM_{11}$ to $CM_{mn}$) ($CM_{11}$ to $CM_{mn}$) correspond to the synapses of the AI system.

The cross-point memories ($CM_{11}$ to $CM_{mn}$) store data, with memories corresponding to a pair of the second wiring lines constituting one set of memories. If there is input from a prior stage of the resistive crossbar network, for example, then VS is inputted to a second wiring line $B_1$ according to the input, and $-VS$ is inputted to the second wiring line $B_2$. Accordingly, data is stored in the cross-point memory $CM_{11}$ and the cross-point memory $CM_{21}$. In cross-point memories following the cross-point memory $CM_{31}$ and the cross-point memory $CM_{41}$ as well, data is stored according to input from a prior stage resistive crossbar network. The cross-point memories $CM_{11}$ to $CM_{m1}$ are provided on the same first wiring line Si, and a signal of the weighted sum of data stored in the cross-point memories $CM_{11}$ to $CM_{m1}$ (signal corresponding to the sum of read-out currents from the respective cross-point memories $CM_{11}$ to $CM_{m1}$) is outputted to the electronic neuron $NR_1$ and stored. In other second wiring lines $B_m$ as well, data is similarly stored in the cross-point memories $CM_{1n}$ to $CM_{mn}$ according to input from a prior stage resistive crossbar network, and a signal of the weighted sum of data stored in the crosspoint memories $CM_{1n}$ to $CM_{mn}$ is outputted to the electronic neurons $NR_n$ and stored. Data stored in the electronic neurons ($NR_1$ to $NR_n$) is configured to be inputted to the subsequent stage resistive crossbar network.

Figure 30:
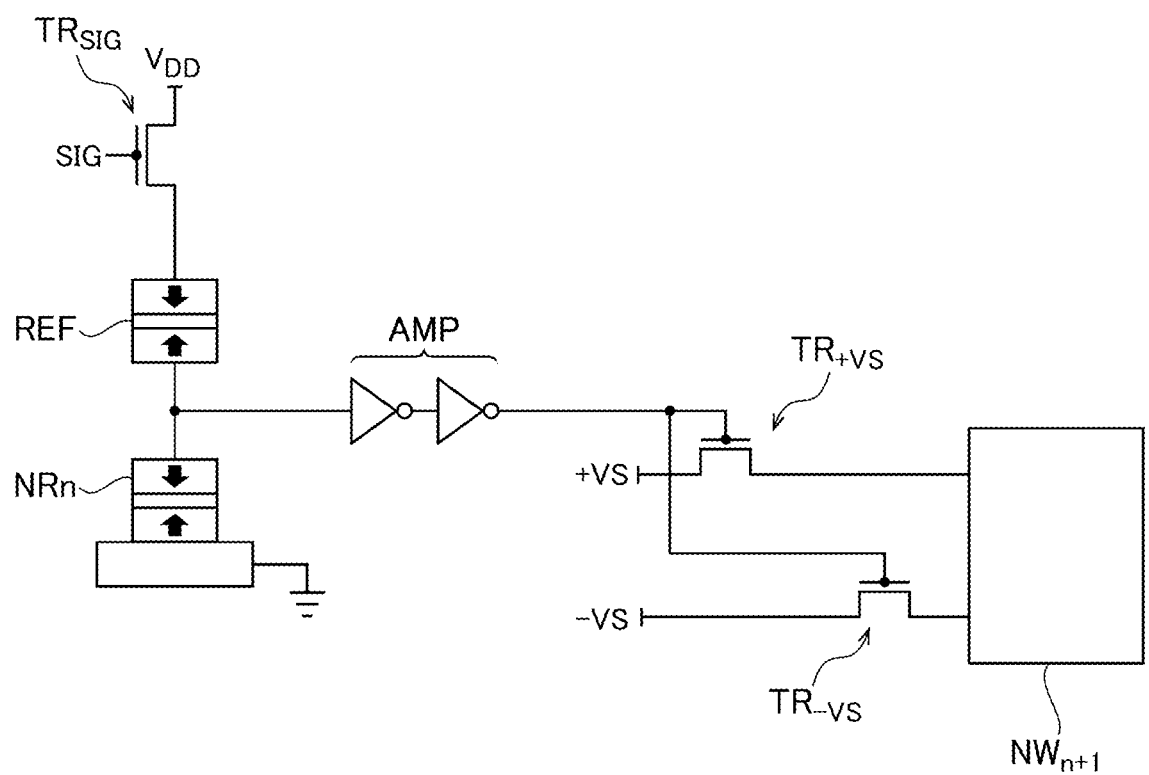
FIG. 30 is circuit diagram of the one example of the AI system using the magnetic memory elements.

FIG. 30 is circuit diagram of the one example of the AI system using the magnetic memory elements. A reference element REF is connected in series to the electronic neuron $NR_n$ from which data is to be read. The reference element REF is constituted of a magnetic memory element similar to the electronic neuron $NR_n$ and has a prescribed resistance. A power source voltage $V_{DD}$ is inputted to the reference element REF via a transistor $TR_{SIG}$, and the electronic neuron $NR_n$ is connected to ground. When a read-out allow signal SIG is inputted to turn ON the transistor $TR_{SIG}$, the power source voltage $V_{DD}$ is inputted to the reference element REF.

In this configuration, when the electronic neuron $NR_n$ stores "1" and is in a high resistance state, the output from the connection point between the electronic neuron $NR_n$ and the reference element REF reaches a high potential, the high potential signal is inputted via an amplifier AMP to a transistor $TR_{+VS}$ and a transistor $TR_{-VS}$, and a $+VS$ signal and a $-VS$ signal are inputted to a subsequent stage resistive crossbar network $NW_{n+1}$.

In this configuration, when the electronic neuron $NR_n$ stores "0" and is in a low resistance state, the output from the connection point between the electronic neuron $NR_n$ and the reference element REF reaches a low potential, and the low potential signal is inputted via an amplifier AMP to the transistor $TR_{+VS}$ and the transistor $TR_{-VS}$. As a result, the $+VS$ signal and the $-VS$ signal are not inputted to the subsequent stage resistive crossbar network $NW_{n+1}$.

As described above, the magnetic memory elements of the present embodiment are used such that the output from a prior stage of the resistive crossbar network is inputted to the subsequent stage of the resistive crossbar network, thereby constituting the AI system.

Modification Example 2

Figure 31:
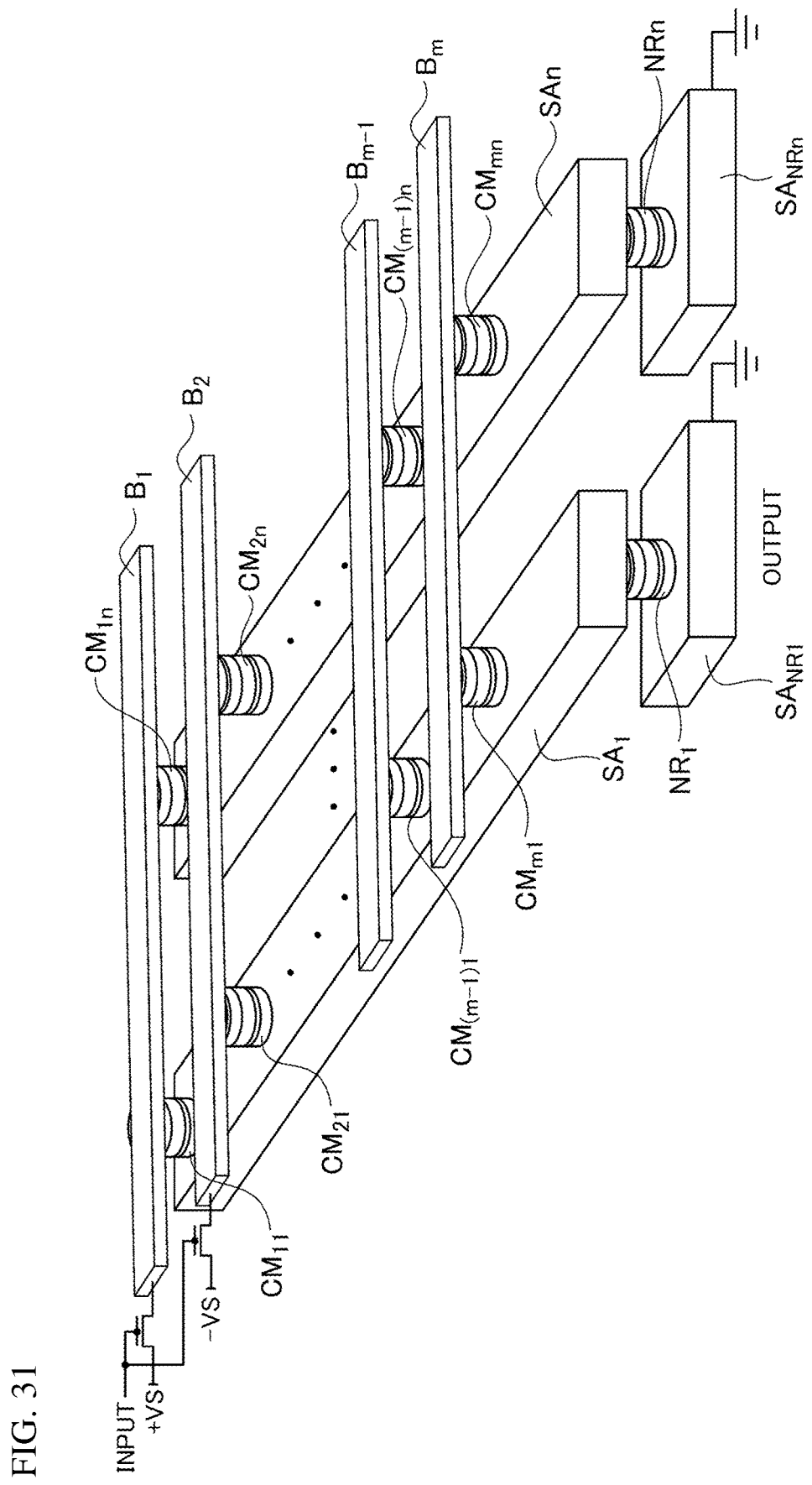
FIG. 31 is a schematic perspective view of another example of the AI system using the magnetic memory elements.

FIG. 31 is a schematic perspective view of another example of the AI system using the magnetic memory elements.

In addition to the electronic neurons ($NR_1$ to $NR_n$) having a similar configuration to the magnetic memory element 100D, the cross-point memories ($CM_{11}$ to $CM_{mn}$) also have a similar configuration to the magnetic memory elements 100D. In other words, the first wiring lines to which the cross-point memories ($CM_{11}$ to $CM_{mn}$) are provided are the common substrates ($SA_1$ to $SA_n$) and are constituted of a laminate including the substrate 5, the buffer layer 4, and the heavy metal layer 2. The heavy metal layer 2 provided in each of the common substrates ($SA_1$ to $SA_n$) is constituted of amorphous layers having a structure in which the first layers containing Hf and the second layers containing a heavy metal excluding Hf are alternately layered.

As described above, the magnetic memory elements of the present embodiment are used such that the output from a prior stage of the resistive crossbar network is inputted to the subsequent stage of the resistive crossbar network, thereby constituting the AI system.

Modification Example 3

Figure 32:
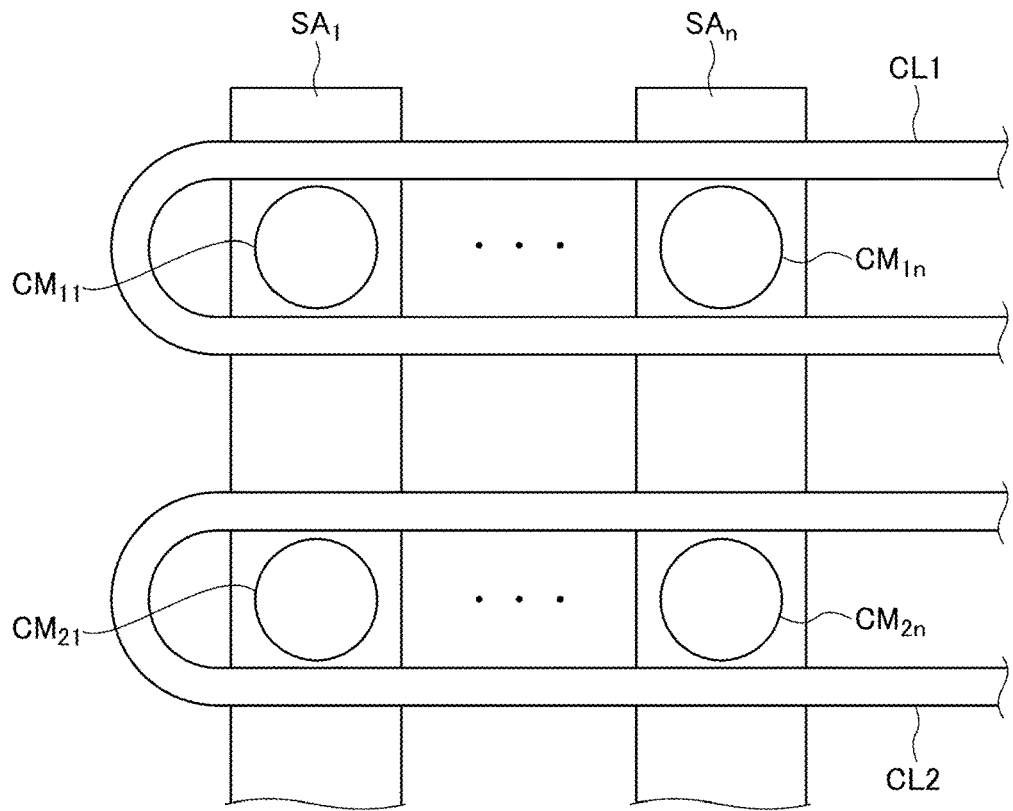
FIG. 32 is a plan view of another example of the AI system using the magnetic memory elements.

FIG. 32 is a plan view of another example of the AI system using the magnetic memory elements. Magnetic field application electrodes (CL1, CL2, etc.) that can apply a prescribed magnetic field upon selecting a prescribed row for performing writing may be provided in an array of the magnetic memory elements constituting the AI system of Embodiment 3. Upon applying the write current $I_W$ to a position of the common substrate (SA1 to SAn), which is a heavy metal wiring line, where the magnetic memory element to which writing is to be performed is present, the magnetic element enters a state where the thermal stability constant is so small that the value cannot be defined as "1" or "0." In this state, by passing a current in a prescribed direction of the magnetic field application electrodes (CL1, CL2, etc.), which are looped wiring lines, for example, a magnetic field in a prescribed direction is generated in the inside region of the loop, and writing is performed. In FIG. 32, in order to clarify the arrangement of the magnetic field application electrodes (CL1, CL2, etc.) in relation to the positions of the common substrates ($SA_1$ to $SA_n$) and the cross-point memories $CM_{11}$, $CM_{21}$ ... $CM_{1n}$, $CM_{2n}$), other members such as the second wiring lines are omitted from depiction to simplify the drawing.

Figure 33:
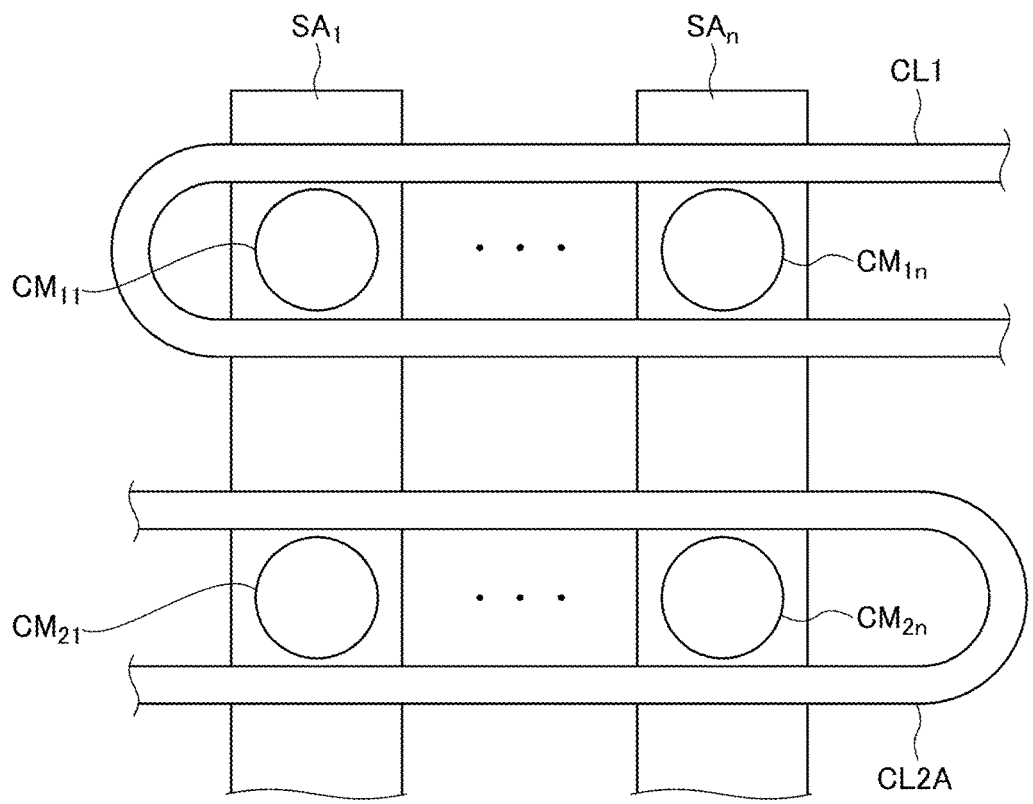
FIG. 33 is a plan view of another example of the AI system using the magnetic memory elements.

FIG. 33 is a plan view of another example of the AI system using the magnetic memory elements. In FIG. 32, the magnetic field application electrodes (CL1, CL2, etc.) are all looped wiring lines that are closed on the left side of the drawing, but the configuration is not limited thereto. As shown in FIG. 33, a configuration may be adopted in which a magnetic field application electrode CL1 that is a looped wiring line where the portion on the left side of the drawing is closed, and a magnetic field application electrode CL2A that is a looped wiring line where the portion on the right side of the drawing is closed are included. By passing a current in a prescribed direction in both the magnetic field application electrode CL1 and the magnetic field application electrode CL2A, a magnetic field in a prescribed direction is generated in the inside region of the loop. In FIG. 33, in order to clarify the arrangement of the magnetic field application electrodes (CL1, CL2A, etc.) in relation to the positions of the common substrates ($SA_1$ to $SA_n$) and the crosspoint memories ($CM_{11}$, $CM_{21}$, ... $CM_{1n}$, $CM_{2n}$), other members such as the second wiring lines are omitted from depiction to simplify the drawing.

DESCRIPTION OF REFERENCE CHARACTERS

1 magnetic multilayer film
2 heavy metal layer
10 recording layer
11 barrier layer
12 reference layer
100 magnetic memory element
$I_W$ write current
$I_r$ read current

The invention claimed is:

1. A magnetic multilayer film for a magnetic memory element, the magnetic multilayer film comprising:
    an amorphous heavy metal layer having a multilayer structure in which a plurality of first layers containing Hf alternate repeatedly with a plurality of second layers containing a heavy metal excluding Hf; and
    a recording layer that includes a ferromagnetic layer and that is formed on the amorphous heavy metal layer, the ferromagnetic layer having a variable magnetization direction.

2. The magnetic multilayer film according to claim 1, wherein each of the second layers contains W or a W alloy.

3. The magnetic multilayer film according to claim 1, wherein each of the second layers contains one or more elements selected from among Co, Fe, and B.

4. The magnetic multilayer film according to claim 1, wherein a layer of the amorphous heavy metal layer that is closest to the recording layer is one of the first layers.

5. The magnetic multilayer film according to claim 1, wherein a thickness of the amorphous heavy metal layer is in a range from 1.4 nm to 9 nm.

6. A magnetic memory element, comprising:
    the magnetic multilayer film according to claim 1;
    a barrier layer that is formed on the recording layer and that is made of an insulator; and
    a reference layer that is formed on the barrier layer, the reference layer having a fixed magnetization direction, wherein
    the magnetization direction of the ferromagnetic layer of the recording layer is reversible by a write current passing through the amorphous heavy metal layer.

7. The magnetic memory element according to claim 6, further comprising:
    a first terminal provided on a first end of the amorphous heavy metal layer in a lengthwise direction thereof, and that supplies the write current to the amorphous heavy metal layer;
    a second terminal provided on a second end of the amorphous heavy metal layer in the lengthwise direction thereof opposite to the first end of the amorphous heavy metal layer, and that supplies the write current to the amorphous heavy metal layer; and
    a third terminal electrically connected to the reference layer, wherein
    the write current passes between the first terminal and the second terminal via the amorphous heavy metal layer.

8. The magnetic memory element according to claim 6, wherein the magnetization direction of the ferromagnetic layer of the recording layer is perpendicular to a surface of the ferromagnetic layer.

9. A magnetic memory, comprising:
    the magnetic memory element according to claim 6,
    a writing circuit that includes a writing source for writing data to the magnetic memory element by passing the write current through the amorphous heavy metal layer; and
    a reading circuit that includes a read-out source for passing a read-out current through the barrier layer, and a current detector that detects the read-out current passing through the barrier layer and that reads the data written to the magnetic memory element.

10. The magnetic memory according to claim 9, wherein a laminate including the recording layer, the barrier layer, and the reference layer, as seen from a side opposite to the amorphous heavy metal layer, is asymmetrical in relation to a direction along the write current.

11. An artificial intelligence system, wherein the magnetic memory element according to claim 6 is used as an electronic neuron to which a weighted sum of a resistive crossbar network is inputted.

12. The artificial intelligence system according to claim 11, wherein the magnetic memory element is additionally used as a cross-point memory of the resistive crossbar network.

13. The artificial intelligence system according to claim 11, wherein a laminate including the recording layer, the barrier layer, and the reference layer, as seen from a side opposite to the amorphous heavy metal layer, has line symmetry in relation to a direction along the write current.

\* \* \* \* \*